(12) United States Patent
Gaku et al.

(10) Patent No.: US 6,376,908 B1
(45) Date of Patent: Apr. 23, 2002

(54) SEMICONDUCTOR PLASTIC PACKAGE AND PROCESS FOR THE PRODUCTION THEREOF

(75) Inventors: Morio Gaku; Nobuyuki Ikeguchi; Nobuyuki Yamane, all of Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/207,115

(22) Filed: Dec. 8, 1998

(30) Foreign Application Priority Data

| Dec. 10, 1997 | (JP) | 9-340129 |
|---|---|---|
| Jan. 6, 1998 | (JP) | 10-000975 |
| Jan. 12, 1998 | (JP) | 10-003984 |
| Jan. 13, 1998 | (JP) | 10-004835 |
| Jan. 13, 1998 | (JP) | 10-004836 |
| Jan. 21, 1998 | (JP) | 10-009567 |
| Jan. 21, 1998 | (JP) | 10-009568 |
| Jan. 23, 1998 | (JP) | 10-011528 |
| Jan. 28, 1998 | (JP) | 10-015893 |
| Jan. 29, 1998 | (JP) | 10-017045 |
| Jan. 30, 1998 | (JP) | 10-034232 |
| Jan. 30, 1998 | (JP) | 10-034233 |
| Jan. 30, 1998 | (JP) | 10-034234 |
| Jan. 30, 1998 | (JP) | 10-034235 |
| Jan. 30, 1998 | (JP) | 10-034236 |
| Jan. 30, 1998 | (JP) | 10-034238 |
| Feb. 20, 1998 | (JP) | 10-038917 |

(51) Int. Cl.$^7$ .................. H01L 23/10; H01L 23/34; H01L 23/12; H01L 23/14

(52) U.S. Cl. .............. 257/707; 257/701; 257/702; 257/706; 257/711; 257/712; 257/713; 257/780; 257/774

(58) Field of Search .............. 257/701, 702, 257/706, 707, 711, 712, 728, 736, 780, 713, 698, 774

(56) References Cited

U.S. PATENT DOCUMENTS

| 4,682,270 | A | * | 7/1987 | Whitehead et al. | 361/401 |
|---|---|---|---|---|---|
| 4,890,152 | A | * | 12/1989 | Hirata et al. | 357/72 |
| 5,397,917 | A | * | 3/1995 | Ommen et al. | 257/698 |
| 5,642,261 | A | * | 6/1997 | Bond et al. | 361/704 |
| 5,710,459 | A | | 1/1998 | Teng et al. | |
| 6,097,089 | A | * | 8/2000 | Gaku et al. | 257/712 |

FOREIGN PATENT DOCUMENTS

| DE | 4443424 A1 | 6/1995 |
|---|---|---|
| EP | 0692823 A1 | 1/1996 |

OTHER PUBLICATIONS

Patent Abstracts of Japan, vol. 017, No. 310 (E–1380), Jun. 14, 1993 and JP 05029502A (NEC IC Microcomput Syst Ltd), Feb. 5, 1993.

* cited by examiner

Primary Examiner—Tom Thomas
Assistant Examiner—Nitin Parekh
(74) Attorney, Agent, or Firm—Wenderoth, Lind & Ponack, L.L.P.

(57) ABSTRACT

A semiconductor plastic package excellent in heat diffusibility and free of moisture absorption, is structured by fixing a semiconductor chip on one surface of a printed circuit board, connecting a semiconductor circuit conductor to a signal propagation circuit conductor formed on a printed circuit board surface in the vicinity thereof by wire bonding, at least connecting the signal propagation circuit conductor on the printed circuit board surface to a signal propagation circuit conductor formed on the other surface of the printed circuit board or a connecting conductor pad of a solder ball with a through-hole conductor, and encapsulating the semiconductor chip with a resin. The printed circuit board has a metal sheet of nearly the same size as the printed circuit board and is nearly in the center in the thickness direction of the printed circuit board. The metal sheet is insulated from front and reverse circuit conductors with a heat-resistant resin composition, and the metal sheet is provided with a clearance hole having a diameter greater than a diameter of each of at least two through holes. The through-holes are provided in the clearance hole, and a through-hole or through-holes are insulated from the metal sheet with a resin composition, with at least one through-hole being connected to the metal sheet. One surface of the metal sheet is provided with at least one protrusion portion which is of the same size as the semiconductor chip and exposed on a surface, and the semiconductor chip is fixed on the protrusion portion.

5 Claims, 7 Drawing Sheets

FIG. 2
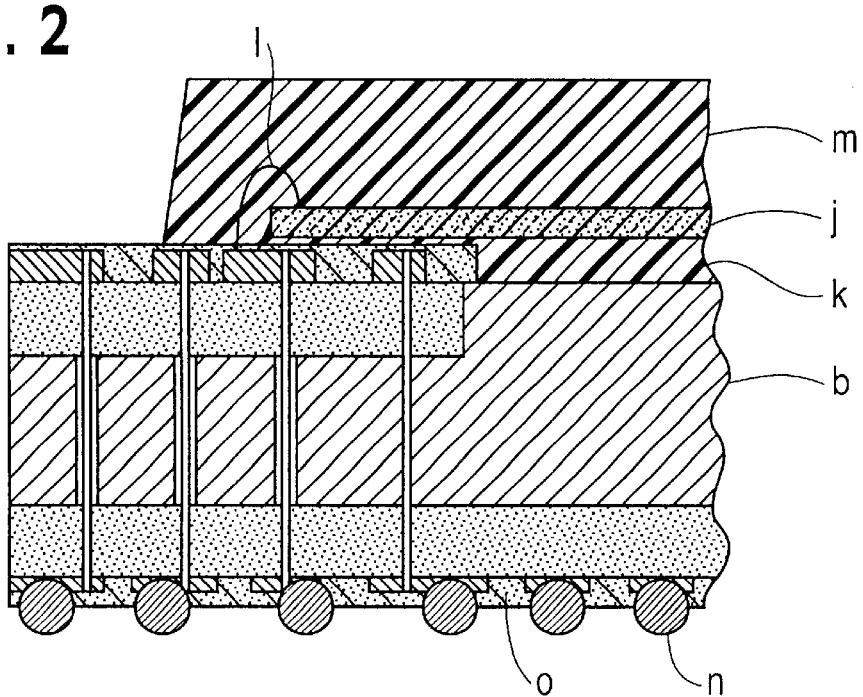
FIG. 3
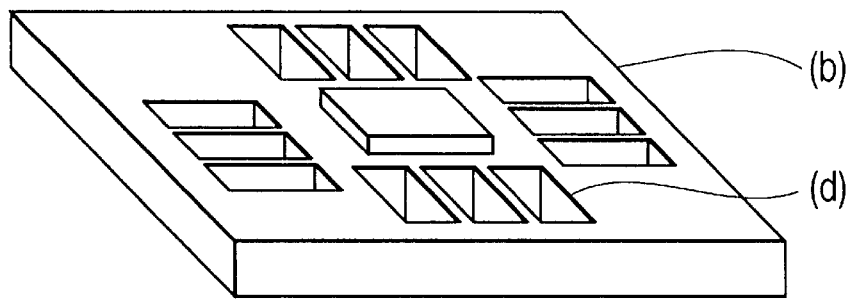
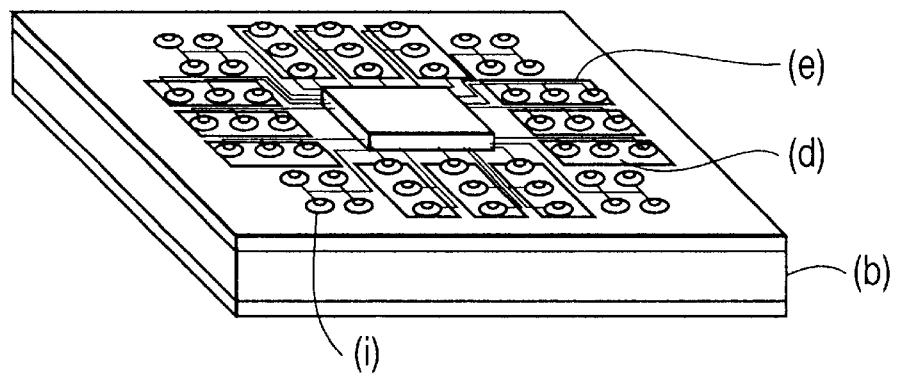

SEMICONDUCTOR PLASTIC PACKAGE AND PROCESS FOR THE PRODUCTION THEREOF

FIELD OF THE INVENTION

The present invention relates to a novel semiconductor plastic package in the form of a semiconductor chip mounted on a small printed circuit board, and a process for the production of a double-side copper-clad laminate for use in the package. The semiconductor plastic package is feasible particularly as a high-watt and multi-terminal high-density semiconductor plastic package such as a microprocessor, a microcontroller, ASIC or graphic controller or processor. The present semiconductor plastic package is mounted on a motherboard printed circuit board with a solder ball for use as an electronic part or device.

BACKGROUND OF THE INVENTION

There are conventionally known semiconductor plastic packages such as a plastic ball grid array P-BGA) and a plastic land grid array (P-LGA), which are structured by fixing a semiconductor chip on the upper surface of a plastic printed circuit board, bonding the semiconductor chip to a conductor circuit formed on the upper surface of the printed circuit board by wire-bonding, forming a conductor pad for connection to a motherboard printed circuit board on the lower surface of the printed circuit board with a solder ball, connecting front and reverse circuit conductors through a plated through-hole and encapsulating the semiconductor chip with a resin. In the above known structure, a plated heat-diffusible through-hole for connection from a metal foil on the upper surface for fixing the semiconductor chip to the lower surface is formed for diffusing heat generated in the semiconductor chip to the motherboard printed circuit board.

There is a risk that moisture may be absorbed into a silver-powder-containing resin adhesive used for fixing a semiconductor through the above through-hole and may cause interlayer swelling due to heating at a time of mounting on the motherboard or heating when a semiconductor part is removed from the motherboard. This swelling is called the "popcorn phenomenon." When the popcorn phenomenon takes place, the package is no longer usable in most cases, and it is immensely important to overcome the above phenomenon.

Further, attaining higher functions of a semiconductor and increasing a density thereof imply an increase in the amount of heat to be generated, and the formation of only a through-hole immediately below the semiconductor chip for diffusing heat is no longer sufficient.

SUMMARY OF THE INVENTION

It is an object of the present invention to provide a semiconductor plastic package having excellent heat diffusibility for overcoming the problems of an increase in the amount of heat caused by attaining higher functions of a semiconductor and increasing a density thereof, and a process for the production thereof.

It is another object of the present invention to provide a semiconductor plastic package which is free of absorption in the lower surface of a semiconductor chip so that it is remarkably improved in heat durability after moisture absorption, i.e., the popcorn phenomenon, and which can be remarkably improved in heat diffusibility, and a process for the production thereof.

It is further another object of the present invention to provide a semiconductor plastic package which is feasible for mass-production and improved in economic performances and which has a novel structure, and a process for the production thereof It is still further another object of the present invention to provide a semiconductor plastic package which is excellent in heat durability, electric insulation properties after being treated in a pressure cooker and anti-migration properties owing to the use of a thermosetting resin composition containing a polyfunctional cyanate ester or a polyfunctional cyanate ester prepolymer as an essential component, and a process for the production thereof.

According to the present invention, there is provided a semiconductor plastic package structured by fixing a semiconductor chip on one surface of a printed circuit board, connecting a semiconductor circuit conductor to a signal propagation circuit conductor formed on a printed circuit board surface in the vicinity thereof by wire bonding, at least connecting the signal propagation circuit conductor on the printed circuit board surface to a signal propagation circuit conductor formed on the other surface of the printed circuit board or a connecting conductor pad of a solder ball with a through-hole conductor, and encapsulating the semiconductor chip with a resin, the printed circuit board having a metal sheet of nearly the same size as the printed circuit board, and nearly in the center in the thickness direction of the printed circuit board the metal sheet being insulated from front and reverse circuit conductors with a heat-resistant resin composition. The metal plate is provided with a clearance hole having a diameter greater than the diameter of each of at least two through-holes, the through-holes being provided in the clearance hole, and the through-hole or through-holes being insulated from the metal sheet with a resin composition. At least one through-hole is connected to the metal sheet, one surface of the metal sheet being provided with at least one protrusion portion which is of the same size as the semiconductor chip and exposed on a surface, the semiconductor chip being fixed on the protrusion portion.

According to the present invention, there is also provided a semiconductor plastic package structured by fixing a semiconductor chip on one surface of a printed circuit board, connecting a semiconductor circuit conductor to a signal propagation circuit conductor formed on a printed circuit board surface in the vicinity thereof by wire bonding, at least connecting the signal propagation circuit conductor on the printed circuit board surface to a signal propagation circuit conductor formed on the other surface of the printed circuit board or a connecting conductor pad of a solder ball with a through-hole conductor, and encapsulating the semiconductor chip with a resin, the printed circuit board having a metal sheet of nearly the same size as the printed circuit board, and nearly in the center in the thickness direction of the printed circuit board, the metal sheet being insulated from front and reverse circuit conductors with a heat-resistant resin composition. The metal plate is provided with a clearance hole having a diameter greater than the diameter of each of at least two through-holes, the through-holes being provided in the clearance hole, and the through-hole or through-holes being insulated from the metal sheet with a resin composition. At least one through-hole is connected to the metal sheet, one surface of the metal sheet being provided with at least one protrusion portion which is of the same size as the semiconductor chip and exposed on a surface, the semiconductor chip being fixed on the protrusion portion, the other surface of the metal sheet being provided with a protrusion surface exposed for diffusing heat.

According to the present invention, further, there is provided a process for the production of a dual-side metal-foil-clad laminate for a semiconductor plastic package structured by disposing a metal sheet of nearly the same size as a printed circuit board nearly in the center in the thickness direction of the printed circuit board, providing at least one exposed metal sheet protrusion of nearly the same size as a semiconductor chip on one surface of the printed circuit board, fixing the semiconductor chip thereon, connecting the semiconductor chip to a signal propagation circuit conductor formed on a printed circuit board surface in the vicinity thereof by wire bonding, at least connecting the signal propagation circuit conductor on the printed circuit board surface to a signal propagation circuit conductor formed on the other surface of the printed circuit board or a connecting conductor pad of a solder ball with a through-hole conductor, and encapsulating the semiconductor chip with a resin, the process comprising the steps of:
(1) forming a protrusion on one surface of the metal sheet for mounting the semiconductor chip, and forming a clearance hole having a diameter greater than the diameter of a through-hole or a slit whose minor side is greater than the diameter of the through-hole for providing the through-hole for the conduction of front and reverse circuit conductors,
(2) disposing a low-flow or no-flow prepreg sheet or resin layer having a hole slightly greater than the area of the protrusion portion on the protrusion position on the side where the metal protrusion portion is formed, disposing a high-flow prepreg sheet or resin layer having a resin amount and a resin flow for being sufficiently filled in the clearance hole on the other side, and disposing metal foils or single-side metal-foil-clad laminates on both outer sides thereof, and
(3) laminate-forming the resultant set under heat and under pressure, to integrate it and form a metal-sheet-inserted double-side metal-foil-clad laminate.

BRIEF DESCRIPTION OF DRAWINGS

FIG. 2 is a semiconductor-chip-mounted enlarged cross-sectional view showing a case where the protrusion portion formed on one surface of a metal sheet has a smaller area than a semiconductor chip in the present invention.

FIG. 3 schematically shows a metal sheet in which slit-shaped clearance holes are formed and a printed circuit board having the metal sheet.

DETAILED DESCRIPTION OF THE INVENTION

Figure 1:
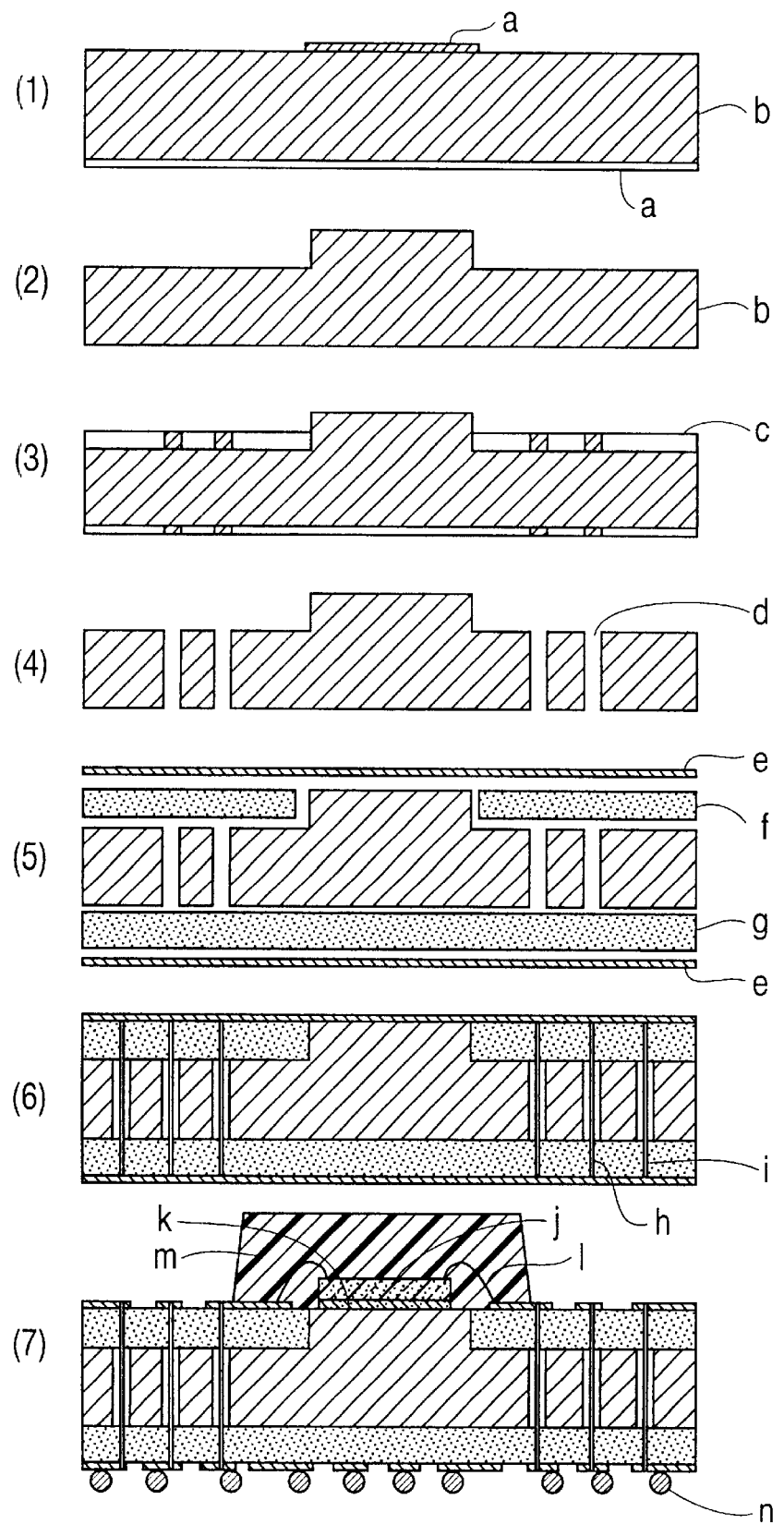
FIG. 1 schematically shows steps of producing a plastic package of the present invention.

In the semiconductor plastic package of the present invention, a metal sheet having excellent heat diffuisibility is disposed in the center in the thickness direction of a printed circuit board. A plated through-hole for the conduction of front and reverse circuit conductors has a diameter smaller than a diameter of a clearance hole made in the metal sheet, and the plated through-hole is formed nearly in the center of resin that has filled in the clearance hole so that the insulation of the through-hole from the metal sheet is secured.

In a known method of fixing a semiconductor chip on the upper surface of a printed circuit board having a through-holed metal sheet as an inner layer, heat from the semiconductor chip is inevitably transmitted into a heat-diffusing through-hole immediately below it, like a conventional P-PGA package, and it is not possible to overcome the popcorn phenomenon.

The printed circuit board for a semiconductor plastic package, prepared by the use of a dual-side copper-clad laminate obtained according to the present invention, is structured as follows. At least one metal protrosion portion for fixing a semiconductor chip with a heat-conductive adhesive is exposed on a board surface. A clearance hole having a diameter greater than a through-hole diameter is made in a position where a through-hole is to be formed. A through-hole having a diameter smaller than the clearance hole diameter is made nearly in the center of the clearance hole, front and reverse circuits are connected with a plating, and at least one through-hole is directly connected to the metal sheet as an inner layer. Therefore, heat generated from a semiconductor of a plastic package prepared by fixing a semiconductor chip, wire-bonding it and encapsulating it with a resin is thermally conducted from a metal portion where the semiconductor chip is directly mounted to the metal sheet as a whole. In the above structure, therefore, the heat is transmitted from a position different from the position immediately below the semiconductor chip, and it is transmitted to a metal pad on the lower surface through the through-hole connected to the metal sheet and is diffused into a motherboard printed circuit board.

In the present invention, first, at least one protrusion having a proper size for fixing a semiconductor chip is formed on a metal sheet by a known etching method, cold machining method or press-rolling deformation method. The projection portion generally has a size nearly equal to the size of a semiconductor chip. Then, a clearance hole is made in a position where a through-hole is to be formed, by a known etching method, punching method, drilling method or laser method (FIG. 3). The clearance hole permits the formation of a through-hole for the front-reverse surface conduction, and has a size greater than the diameter of the through-hole to some extent.

Heat generated by a semiconductor is thermally conducted from a metal portion on which a semiconductor chip is directly mounted to the metal sheet as whole, and therefore, at least one plated through-hole is formed from a place different from the position immediately below the semiconductor chip to a metal pad on a lower surface through the metal sheet, so that the heat from the semiconductor chip is diffused into a motherboard printed circuit board.

The metal sheet on which the protrusion for fixing a semiconductor chip and the through-hole are formed is surface-treated as required according to known methods to be oxidized, to form fine concavo-convex shapes and to form a coating for improving adhesion and electric insulation. In the surface-treated metal sheet having the protrusion portion and the clearance hole formed, an insulation portion of a thermosetting resin composition is formed on all the surfaces thereof other than the surface on which a semiconductor chip is to be fixed. The insulation portion of the thermosetting resin composition is formed by providing prepregs of a thermosetting resin composition in a semi-cured state, making a hole having a slightly larger size than the protrusion portion in the protrusion-corresponding portion of the prepreg in advance, placing the prepreg on the surface having the protrusion on which a semiconductor chip is to be directly fixed, stacking the other prepreg on the other surface of the metal sheet so as to cover all the surface, and laminate-forming the resultant set under heat and pressure. The thickness of the prepreg is arranged to be a little larger than the height of the metal protrusion. During the heating and pressurizing step, the thermosetting resin in a semi-cured state, once melted by heat, is flowed into the clearance hole of the metal sheet to fill in the clearance hole, and at the same time, the surfaces other than the metal protrusion portion are integrated with the thermosetting resin composition.

Further, the insulation portion may be formed by providing a solvent-less or solvent-type thermosetting resin composition, applying the thermosetting resin composition to all the surfaces of the metal sheet other than the metal protrusion portion by screen printing, etc., heating the thermosetting resin composition to bring it into a semicured state, then, placing metal foils on outer sides and laminate-forming the resultant set under heat and pressure to integrate the metal foils and the metal sheet. In the laminate-forming, the resin is flowed into the clearance hole, and at the same time, the resin is thermally cured. When the resin is filled in the clearance hole in advance, the resin is applied by screen printing, etc., flowed into the clearance hole under low pressure, and a solvent or air is removed by heating, to thermally cure the resin. When a solvent is contained, the resin is liable to be insufficiently filled in the clearance hole. A solvent-less liquid thermosetting resin composition is therefore preferred, and it is flowed into the clearance hole and cured in advance. Then, the resin is applied to surfaces other than the exposed metal portion used for mounting a semiconductor chip, by screen printing, etc., and heated to bring it into a semi-cured state. Then, metal foils are placed on outer sides, and the resultant set is laminate-formed under heat and pressure. In any method, the clearance hole of the metal sheet is filled with a thermosetting resin composition. The side surfaces of the metal sheet may be in any state where they are coated with the thermosetting resin composition or exposed.

For the formation of a through-hole printed circuit board by a subtractive method, metal foils or single-side copper clad laminates having a slightly larger size than a printed circuit board are placed on front and reverse outermost layers, and the resultant set is laminate-formed under heat and pressure, whereby a metal-foil-clad multi-layered board having front and reverse surfaces covered with metal foils for the formation of outer layer circuits is formed.

When the laminate-forming is carried out without using metal foils as the front and reverse layers, a circuit is formed by a known additive method, to form a printed circuit board.

In the board prepared by the above subtractive method or additive method, a hole having a small diameter for a through-hole for the front and reverse circuit conduction and a hole having a small diameter for diffusing heat by connection to the metal sheet are made in portions different from the portion where a semiconductor is fixed, by a known method using a laser, plasma, etc.

The hole for a through-hole for the conduction of front and reverse signal circuits is formed nearly in the center of the metal sheet clearance hole filled with the resin, so as not to be in contact with the metal sheet. Then, a metal layer is formed in the through-hole by electroless plating or electric plating, to form a plated through-hole. In a full additive method, wire-bonding terminals, signal circuits, a pad for a solder ball and conductor circuits are formed on the front and reverse surfaces simultaneously.

In a semi-additive method, the through-hole is plated, and at the same time, the front and reverse surfaces are also plated. Then, circuits are formed on the upper and lower surfaces by a known method.

In a printed circuit board formed by the laminate-forming using metal foils on the front and reverse surfaces, metal foil on the surface of the metal protrusion portion for fixing a semiconductor chip is also removed at the step of forming circuits on the front and reverse surfaces. Then, at least the surface of a wire-bonding pad is plated with a noble metal for wire-bonding, whereby the printed circuit board is completed. In this case, portions which require no plating with a noble metal are covered with a plating resist in advance. Otherwise, after the plating, a coating of a known thermosetting resin composition or a photo-selective thermosetting resin composition is formed on the plated surface as required.

A semiconductor chip is fixed on the surface of the metal protrusion portion of the above printed circuit board with an adhesive or a metal-powder-containing adhesive. Further, the semiconductor chip and the bonding pad of the printed circuit board are connected by a wire bonding method, and at least the semiconductor chip, the bonding wire and the bonding pad are encapsulated with a known encapsulation resin.

A solder ball is connected to a solder-ball-connecting conductor pad on the surface opposite to the semiconductor chip, to prepare P-BGA, and the solder ball is stacked on a circuit on a motherboard printed circuit board and melted by heating it for connection. Otherwise, P-LGA is prepared without adding a solder ball to the package, and when it is mounted on a motherboard printed circuit board, a solderball-connecting conductor pad formed on the mother board printed circuit board surface and a conductor pad for a solder ball for P-LGA are connected by heating and melting the solder ball.

Although not specially limited, the metal sheet for use in the present invention is preferably selected from those having a high elastic modulus and a high heat conductivity and having a thickness of 30 to 300 $\mu$m. Specifically, it is preferred to use pure copper, oxygen-free copper, an alloy of copper with Fe, Sn, P, Cr, Zr, Zn or the like, or a metal sheet prepared by plating an alloy with copper.

In the present invention, the protrusion portion preferably has a height of 30 to 200 $\mu$m. Further, the prepreg having a hole for the protrusion portion or the thermosetting resin formed by screen printing preferably has a height equal to, or slightly larger than, the protrusion portion height. The area of the protrusion portion is sufficient if a semiconductor chip can be mounted thereon. Generally, it is equal, or slightly larger than, the area of a semiconductor chip, and it generally has a size having sides of 5 to 20 mm.

The resin in the thermosetting resin composition for use in the present invention is generally selected from known thermosetting resins. Specific examples thereof include an epoxy resin, a polyfunctional cyanate ester resin, a polyfunctional maleimide-cyanate ester resin, a polyfunctional maleimide resin and an unsaturated-group-containing polyphenylene ether resin. These resins are used alone or in combination. In view of heat durability, humidity durability, anti-migration properties, electric characteristics after moisture absorption, and the like, a polyfunctional cyanate ester resin composition is preferred.

The polyfunctional cyanate ester compound as a preferred thermosetting resin component in the present invention refers to a compound whose molecule has at least two cyanato groups.

Specific examples thereof include 1,3- or 1,4-cyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl) propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate and cyanates obtained by a reaction of novolak with cyan halide.

Besides the above compounds, there may be used polyfunctional cyanate ester compounds described in Japanese Patent Publications Nos. 41-1928, 43-18468, 44-4791, 45-11721, 46-41112, 47-26853 and 51-63149. Further, a prepolymer having a molecular weight of 400 to 6,000 and having a triazine ring formed by the trimerization of a cyanato group of each of these polyfunctional cyanate ester compounds may be also used. The prepolymer is obtained by polymerizing the above polyfunctional cyanate ester monomer in the presence of an acid such as a mineral acid or a Lewis acid, a base such as sodium alcoolate or a tertiary amine or a salt such as sodium carbonate as a catalyst. The prepolymer partly contains an unreacted monomer and is in the form of a mixture of monomer with prepolymer, and this material is preferably used in the present invention. Generally, the above resin is dissolved in an organic solvent in which it is soluble.

The epoxy resin can be generally selected from known epoxy resins. Specific examples thereof include a liquid or solid bisphenol A type epoxy resin, a bisphenol F type epoxy resin, a phenol novolak type epoxy resin, a cresol novolak type epoxy resin, an alicyclic epoxy resin, polyepoxy compounds obtained by epoxidizing the double bond of butadiene, pentadiene, vinylcyclohexene or cyclopentyl ether, and polyglycidyl compounds obtained by reacting a polyol, a silicon resin having a hydroxyl group and epohalohydrin. These resins may be used alone or in combination.

The polyimide resin can be generally selected from known polyimide resins. Examples thereof include reaction products of functional maleimides and polyamines, and polyimides terminated with a triple bond, described in JP-B-57-005406.

The above thermosetting resins may be used alone, while it is preferred to use a combination thereof as required in view of a balance of characteristics.

The thermosetting resin composition used in the present invention may contain various additives as desired so long as the inherent properties of the composition are not impaired. Examples of the additives include monomers containing a polymerizable double bond such as an unsaturated polyester and prepolymers thereof; low-molecular-weight liquid-high-molecular-weight elastic rubbers such as polybutadiene, epoxidized butadiene, maleated butadiene, a butadiene-acrylonitrile copolymer, polychloroprene, a butadiene-styrene copolymer, polyisoprene, butyl rubber, fluorine-containing rubber and natural rubber; polyethylene, polypropylene, polybutene, poly-4-methylpentene, polystyrene, AS resin, ABS resin, MBS resin, styrene-isoprene rubber, a polyeethylene-propylene copolymer, 4-fluoroethylene-6-fluoroethylene copolymer; high-molecular-weight prepolymers or oligomers of polycarbonate, polyphenylene ether, polysulfone, polyester and polyphenylene sulfide; and polyurethane. These additives are used as required. Further, various known additives such as inorganic or organic filler, a dye, a pigment, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition in the present invention undergoes curing itself when heated. Since, however, its curing rate is low, it is poor in economic performances, etc., and a known heat-curing catalyst is incorporated into the thermosetting resin. The amount of the catalyst per 100 parts by weight of the thermosetting resin is 0.005 to 10 parts by weight, preferably 0.01 to 5 parts by weight.

A known inorganic or organic woven fabric or non-woven fabric is generally used as a reinforcing substrate for the prepreg. Specific examples of the reinforcing substrate include known glass fiber cloths such as E glass, S glass and D glass, a wholly aromatic polyamide fiber cloth, and a liquid crystal fiber cloth. These may be mixtures. Further, there may be used a substrate prepared by applying the thermosetting resin to front and reverse surfaces of a film such as a polyimide film and bringing it into a semi-cured state by heating.

The metal foil used as outermost layers can be generally selected from known metal foils. Preferably, there is used a copper foil, an aluminum foil or a nickel foil, each of which has a thickness of 3 to 100 $\mu$m.

The clearance hole or the slit is made in the metal sheet so as to have a size slightly larger than the diameter of the through-hole for the conduction of the front and reverse surfaces. Specifically, the through-hole wall is insulated with the thermosetting resin composition such that the thermosetting resin composition gives a distance of at least 50 μm between the through-hole wall and the wall of the metal sheet clearance hole or slit. Although not specially limited, the through-hole for the the front and reverse surface conduction preferably has a diameter of 50 to 300 mm.

When the prepreg for a multi-layer printed circuit board of the present invention is prepared, the substrate is impregnated with the thermosetting resin composition, and the thermosetting resin composition is dried to obtain a laminating material in a semi-cured state. Further, a substrate-free resin sheet prepared in a semi-cured state may be used. Otherwise, a coating composition may be used. In this case, a coating composition is converted to a high-flow or no-flow material depending upon the degree of a semi-cured state. When it is converted to a no-flow material, the flow of the resin after the laminate-forming under heat and pressure is 100 μm or less, preferably 50 μm or less. In this case, essentially, it bonds to a copper sheet or a copper foil without causing any voids. The heating temperature the laminate-forming is generally 100 to 180° C., the time therefor is 5 to 60 minutes, and the temperature and the time are properly selected depending upon the intended degree of flow.

In the present invention, there may be employed a structure in which the inner layer metal sheet to constitute the above printed circuit board is provided with the protrusion portion of which the diameter or one side length is 40 to 90% of one side of a semiconductor chip (FIG. 2, $j$). The metal-plated through-hole and a circuit conductor are formed in/on those portions of the printed II,) circuit board which are different from the metal protrusion portion immediately below the semiconductor and the circuit conductor of the through-hole and a heat-conductive adhesive (FIG. 2, $k$) are insulated with a heat-curable resist or a photo-selective heat-curable resist. In this case, the semiconductor chip is fixed to the surface of the metal protrusion portion with a metal-powder-containing heat-conductive adhesive. There is formed a structure in which the plated through-hole conductor is formed in a portion different from the metal protrusion portion below the semiconductor chip, and the conductor is coated with a heat-curable resist or a photo-selective heat-curable resist. A heat-conductive adhesive is applied onto the resist, and a semiconductor chip is bonded. In this case, differing from a heat-diffusible through-hole immediately below a conventional gold-plated portion on which a semiconductor chip is to be mounted, the heat-conductive adhesive for bonding a semiconductor chip and the circuit or the through-hole conductor are insulated with a resin composition, and heat generated by the semiconductor chip is transmitted to the metal protrusion portion and diffused into a motherboard through the through-hole (FIG. 2, $i$) connected directly to the metal sheet. In FIG. 2, $o$ shows a plating resist.

In the present invention, as a clearance hole, at least one slit having a size greater than the diameter of the through-hole conductor may be made in the inner layer metal sheet which is to constitute the above printed circuit board. The slit-like clearance hole is made in the metal sheet so as to have a size slightly larger than the diameter of the through-hole for the front and reverse surface conduction. Specifically, the through-hole wall and the metal sheet slit wall are preferably insulated with the thermosetting resin composition such that the thermosetting resin composition gives a distance of at least 50 μm between the through-hole wall and the wall of the metal sheet slit. Although not specially limited, the through-hole for the front and reverse surface conduction preferably has a diameter of 50 to 300 mm. Further, at least one through-hole formed in the slit is structurally in direct contact with the metal so that generated heat is diffused into a motherboard. through this heat-diffusible through-hole. In the above structure, the moisture absorption from the lower surface below a semiconductor chip does not take place either, so that the heat durability after moisture absorption is greatly improved, i.e., that the popcorn phenomenon can be overcome to a great extent, and that the heat diffusibility is greatly improved.

Figure 4:
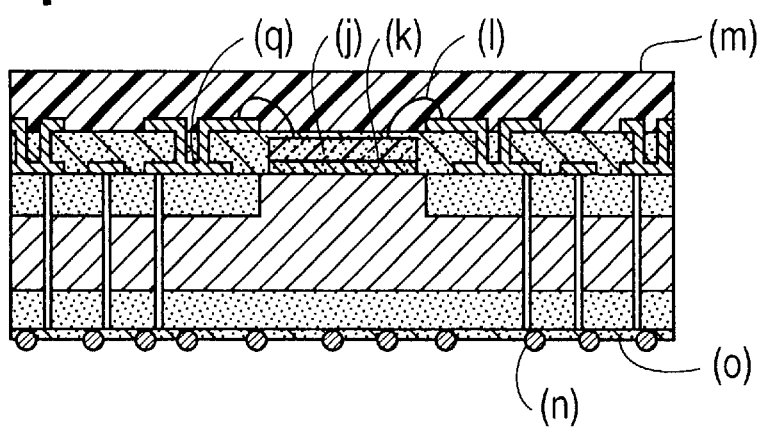
FIG. 4 schematically shows steps of further forming a blind via hole in a dual-side metal-foil-clad laminate produced up to the step shown in FIG. 1(6), in the steps of producing a semiconductor plastic package.

In the present invention, as shown in FIG. 4, there may be employed a structure in which a signal propagation circuit conductor on the front (i.e. top) surface of a printed circuit board and either a signal propagation circuit conductor formed on the reverse (i.e. bottom) surface of the printed circuit board or a circuit conductor pad formed for connection to an outside of the package with a solder ball are connected to each other through a through-hole conductor via at. least one blind via hole (FIG. 4, $q$). In the above structure, the moisture absorption from the lower surface below a semiconductor chip does not take place either, so that the heat durability after moisture absorption is greatly improved, i.e., that the popcorn phenomenon can be overcome to a great extent, and that the heat diffusibility is greatly improved.

The process for the production of the metal-sheet-inserted semiconductor plastic package of the present invention will be explained below.

The present invention is directed to a process for the production of a dual-side, metal-foil-clad laminate for a semiconductor plastic package structured by disposing an inner layer metal sheet of nearly the same size as a printed circuit board, and nearly in the center in the thickness direction of the printed circuit board, providing at least one exposed metal sheet protrusion on one surface of the printed circuit board, fixing a semiconductor chip thereon, connecting the semiconductor chip to a signal propagation circuit conductor formed on a printed circuit board surface in the vicinity thereof by wire bonding, at least connecting the signal propagation circuit conductor on the printed circuit board surface to a signal propagation circuit conductor formed on the other surface of the printed circuit board or a connecting conductor pad of a solder ball with a plated through-hole conductor, and encapsulating the semiconductor chip with resin.

The process comprises the following steps:

(1) forming a protrusion on one surface of the metal sheet for mounting the semiconductor chip, and forming a clearance hole or a slit having a size greater than a diameter of a through-hole, for providing the through-hole for the conduction of front and reverse circuit conductors, (2) disposing a low-flow or no-flow prepreg sheet or resin layer having a hole slightly greater than an area of the protrusion portion on the protrusion position on the side where the metal protrusion portion is formed, disposing a high-flow prepreg sheet or resin layer having a resin amount and a resin flow for sufficiently filling in the clearance hole on the other side, and disposing metal foils or single-side metal-foil-clad laminates on both outer sides thereof, and (3) laminate-forming the resultant set under heat and under pressure, preferably in vacuum, to integrate it and form a metal-core-inserted dual-side metal-foil-clad laminate.

The above dual-side metal-foil-clad laminate is used to prepare a printed circuit board, and a semiconductor chip is fixed with a heat-conductive adhesive such as a silver paste, followed by wire bonding, encapsulation with a resin and attaching of a solder ball.

The above step is carried out as follows.

(4) A through-hole for front and reverse circuit conduction is made in a predetermined position with a drill or laser while keeping the through-hole wall out of contact to the inner layer metal sheet, and a heat-diffusing through-hole is made so as to bring it into contact with the metal sheet. The through-holes are treated for desmearing, followed by plating with a metal. Circuits are formed on the upper and lower surfaces by a known method, and preferably, and metal foil on the metal sheet protrusion portion is removed, followed by plating with a noble metal. A semiconductor chip is bonded to the protrusion surface of the inner layer metal sheet with a metal-powder-containing electrically conductive and thermally conductive adhesive, followed by wire bonding, encapsulation with a resin and attaching of a solder ball.

Heat generated by the semiconductor is thermally conducted to the metal sheet as a whole through the metal portion on which the semiconductor is directly mounted, so that there is employed a structure in which at least one plated through-hole is formed so as to connect to the above metal sheet and a metal pad on the lower surface so that heat from the semiconductor chip is diffused to a motherboard printed circuit board.

In the present invention, the protrusion portion on one surface of the metal sheet and the clearance hole can be also formed by the following method.

(1) First, the entire surface of the metal sheet (FIG. 1, b) is coated with a liquid etching resist (FIG. 1, a), a solvent is removed by heating, the resist is covered with a negative film (FIG. 1, c) prepared so as to leave resist on the protrusion portion on which a semiconductor chip is to be mounted, the resist is exposed to ultraviolet light, and an unexposed portion is dissolved and removed with a solvent such as a 1% sodium carbonate aqueous solution.

(2) A predetermined thickness of the metal sheet is dissolved by etching, and then the etching resist is dissolved and removed.

(3) The upper and lower surfaces are again coated with a liquid etching resist, a negative film having a hole for the metal protrusion portion is placed on the upper surface, a negative film prepared so as to shut off light in the clearance hole portion is placed on the lower surface, and the resultant set is exposed to ultraviolet light.

(4) The etching resist in the clearance hole portion is dissolved and removed, and then both the surfaces are etched by an etching method, to form the clearance hole (FIG. 1, d).

In the present invention, a dual-side metal-foil-clad laminate can be also prepared from the above-obtained metal sheet having the protrusion portion and the clearance hole by the following method.

(5) As a prepreg sheet (FIG. 1, f) on a side where the metal protrusion portion is formed, a low-flow or no-flow prepreg sheet having a hole slightly greater than the area of the protrusion in a position of the protrusion, a copper foil with a resin or a resin layer is provided on the side where the metal protrusion portion is formed, a high-flow prepreg sheet (FIG. 1, g) having a resin amount and a resin flow sufficient for being filled in the clearance hole, a copper foil with a resin or a resin layer is provided on the other side, and metal foils (FIG. 1, e) having a hole slightly greater than the metal protrusion portion as required, or single-side metal-foil-clad laminates are disposed on both the outer sides.

(6) The resultant set is laminate-formed under heat and pressure, preferably in vacuum, to integrate it, whereby there is formed a metal-core-inserted dual-side metal-foil-clad laminate having the metal protrusion exposed on one surface, which is for a semiconductor plastic package.

In the present invention, a dual-side metal-foil-clad laminate of which the laminate is a multi-layer laminate can be also produced by the following method.

(5) As a prepreg sheet on a side where the metal protrusion portion is formed, a low-flow or no-flow prepreg sheet having a hole slightly greater than the area of the protrusion in a position for the protrusion, a resin sheet or an applied resin layer is provided on the side where the metal protrusion portion is formed. A dual-side sheet having a circuit formed on one surface and having a surface chemically treated as required, or a multi-layer sheet is placed outside the protrusion portion, a high-flow prepreg sheet (FIG. 5, g) having a resin amount and a resin flow sufficient for being filled in the clearance hole, a resin sheet, a copper foil with a resin or an applied resin layer is provided on the other surface, and a metal foil (FIG. 5, e) or single-side metal-foil-clad laminates is disposed thereon.

(6) The resultant set is laminate-formed under heat and pressure, preferably in vacuum, to integrate it, whereby there is formed a metal-core-inserted dual-side metal-foil-clad laminate having the metal protrusion exposed on one surface, which is for a semiconductor plastic package.

The above-produced metal-sheet-inserted dual-side copper-clad laminate is used as follows.

(7) a through-hole having a size slightly smaller than the diameter of the clearance hole conductor is made in the above metal-sheet-inserted dual-side copper-clad laminate with a drill, a laser, etc., the hole wall and the metal sheet are insulated with a resin composition and used as a through-hole (FIG. 1, h) for the front and reverse circuit conduction, and at least one through-hole is connected to the metal sheet for use as a through-hole for heat diffusion and is plated with a metal.

(8) Then, circuits are formed on the front and reverse surfaces.

(9) At least portions other than a bonding pad, a solder ball pad and the metal protrusion portion on which to mount a semiconductor chip are coated with a plating resist, and plated with nickel or gold, to prepare a printed circuit board. A semiconductor chip (FIG. 1, j) is bonded and fixed to the metal protrusion portion of the printed circuit board with a metal-powder-containing electrically conductive or thermally conductive adhesive (FIG. 1, k), followed by wire bonding (FIG. 1, l), encapsulation with a resin (FIG. 1, m) and attaching of a solder ball (FIG. 1, n), whereby a multi-layer semiconductor plastic package is formed.

In the present invention, the semiconductor plastic package having the blind via hole can be produced by the following procedures after the formation of front and reverse circuits in the above step (8).

(9) A hole covering only the semiconductor-chip-mounting metal exposed portion is made portion is made in the no-flow or low-flow prepreg with a counter boring machine, the prepreg is placed on the surface, and a 1 $\mu$m thick electrolytic copper foil is placed thereon.

(10) The resultant set is integrated by laminate-formation.

(11) A copper foil present on a surface portion where via hole is formed is removed by etching, a via hole (FIG. 4, q) is formed with a carbon dioxide laser, desmear treatment is carried out, and the reverse surface is covered with a film, followed by plating with copper.

(12) After the front surface is coated with a plating resist (FIG. 4, o), and a noble metal plating is carried out, a semiconductor chip (FIG. 4, *j*) is bonded to the surface of the protrusion portion which is an inner layer metal sheet portion where the semiconductor chip is to be mounted with an adhesive (FIG. 4, *k*), followed by wire bonding (FIG. 4, *i*), then encapustion with a resin (FIG. 4, *m*) and optional attaching of a solder ball (FIG. 4, *n*).

The present invention also provides a process for concurrently forming the metal sheet protrusion portion and the clearance hole by the following procedures.

An etching resist for forming the protrusion portion is placed on part of one surface of a metal sheet, an etching resist for forming the clearance hole or slit by etching is placed on the other surface, and in an etching step, an etching solution is blown onto the protrusion-portion-forming surface at a lower pressure and an etching solution is blown onto the other surface at a higher pressure, whereby the protrusion portion and the clearance hole are formed at the same time.

Figure 5:
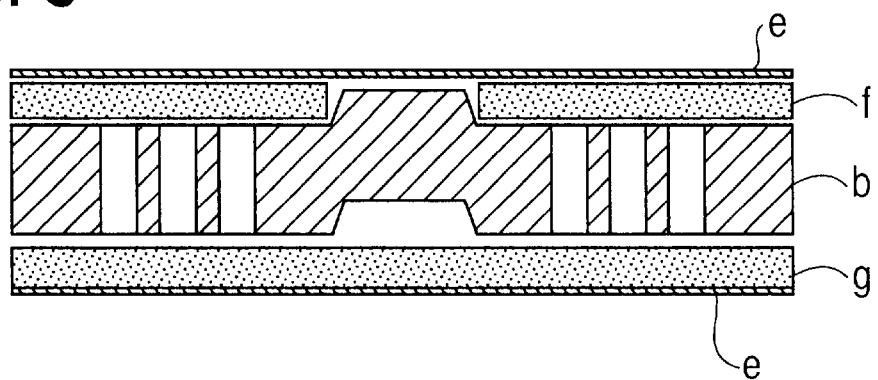
FIG. 5 schematically shows one protrusion portion formed on a metal sheet by embossing.
Figure 6:
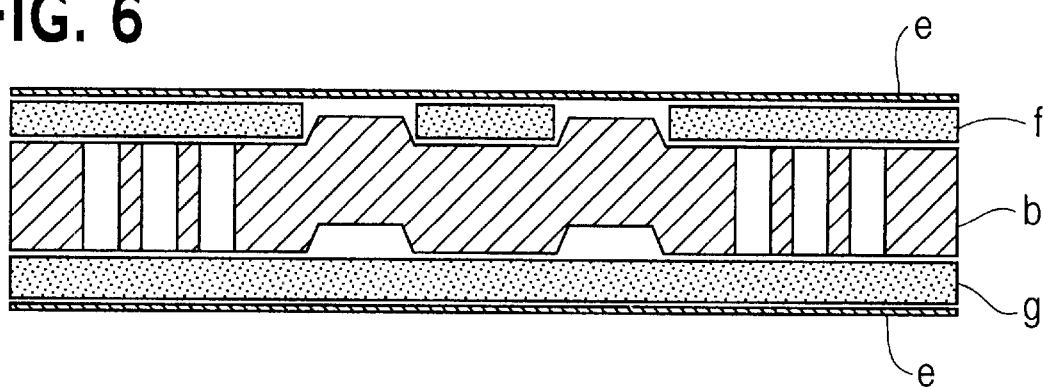
FIG. 6 schematically shows two protrusion portions formed on a metal sheet by embossing.

In the present invention, the protrusion portion of the metal sheet can be formed by the following procedures. That is, a metal sheet is embossed to form at least one protrusion portion structured so as to protrude on one surface and have a dent in the other surface. FIG. 5 shows one protrusion portion formed on a metal sheet b by embossing, and FIG. 6 shows two protrusion portions formed on a metal sheet b by embossing.

Figure 7:
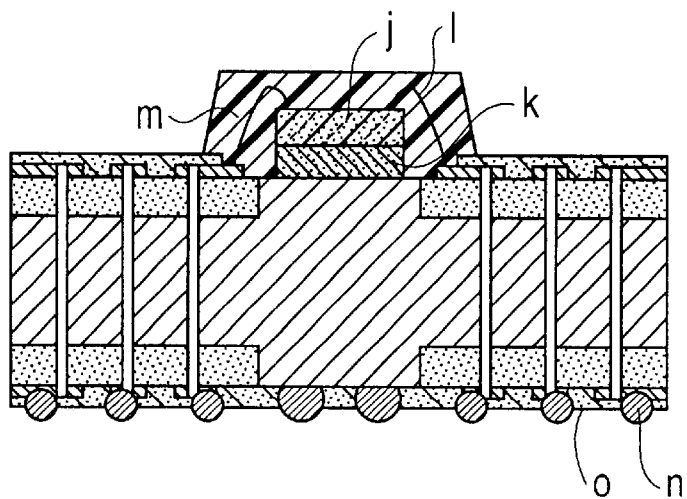
FIG. 7 schematically shows a semiconductor plastic package in which a protrusion portion for mounting a semiconductor chip is formed on one surface of a metal sheet and a protrusion portion for diffusing heat is formed on the other surface.

In the present invention, as shown in FIG. 7, a protrusion portion for mounting a semiconductor chip may be formed on one surface of a metal sheet, and a protrusion for heat diffusion may be formed on the other surface. Since heat diffused from a semiconductor is thermally conducted from the portion on which the semiconductor chip is directly mounted to the metal sheet as a whole, the heat is diffused through the metal protrusion portion exposed on the other surface to a motherboard printed circuit board.

The above protrusion portions can be formed on both the surfaces of a metal sheet, e.g., by the following method.

First, the entire surface of a metal sheet which is to constitute an inner layer is coated with a liquid etching resist, the coating is heated to remove a solvent, and a negative film designed for leaving the protrusion portion on which a semiconductor chip is to be fixed and the resist on the reverse-surface protrusion portion for heat diffusion is covered thereon. This is followed by irradiation with ultraviolet light and removal of unexposed portion by dissolving. Then, a predetermined thickness of the metal sheet is etched, and then the etching resist is removed by dissolving.

Figure 8:
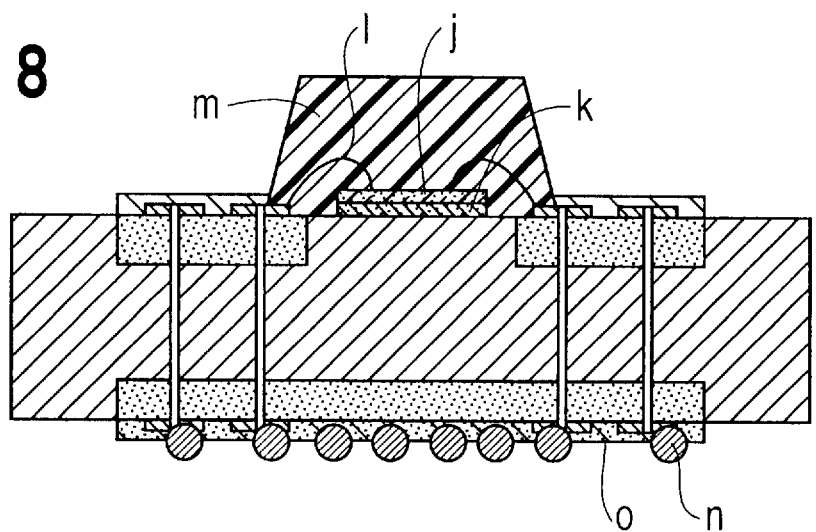
FIG. 8 schematically shows a semiconductor plastic package in which a protrusion portion for mounting a semiconductor chip is formed on one surface of a metal sheet and protrusion portions are formed on the front and reverse surfaces of the metal sheet in positions corresponding to a circumferential portion of a printed circuit board.

As shown in FIG. 8, the protrusion portion on which a semiconductor chip is to be mounted may be formed on one surface of a metal sheet which is to constitute an inner layer, and protrusion portions may be formed in that portion of the metal sheet which corresponds to a marginal portion of a printed circuit board such that the protrusions are exposed on both front and reverse surfaces. The above protrusion portions on the marginal portion are provided for diffusing heat. The above protrusion portions on the metal sheet may be formed by a generally known method such as cold processing, hot roll profile processing other than the above etching method. Further, metal sheet(s) of the same or different quality may be bonded onto a flat smooth metal sheet with an adhesive such as a copper paste having excellent thermal conductivity.

Figure 9:
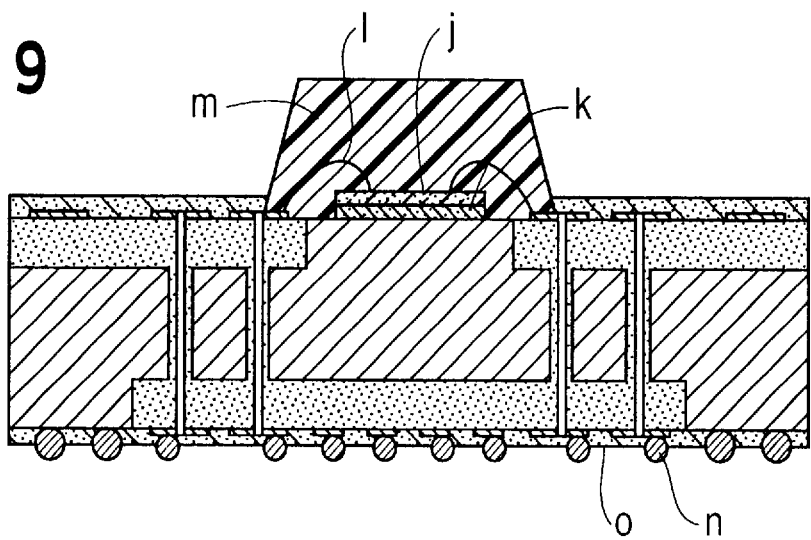
FIG. 9 schematically shows a semiconductor plastic package in which a protrusion portion for mounting a semiconductor chip is formed on one surface of a metal sheet and protrusion portions are formed on the reverse surface of the metal sheet in positions corresponding to a circumferential portion of a printed circuit board.

As shown in FIG. 9, the protrusion for mounting a semiconductor chip may be formed on one surface of a metal sheet which is to constitute an inner layer, and protrusion portions may be formed in that portion of the metal sheet which corresponds to a marginal portion of a printed circuit board such that the protrusions are exposed on the reverse surface.

Figure 10:
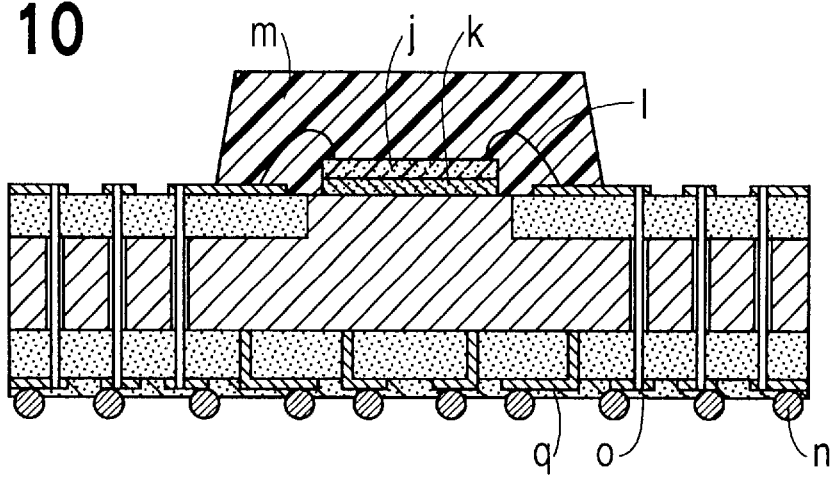
FIG. 10 schematically shows a semiconductor plastic package in which a protrusion portion for mounting a semiconductor chip is formed on one surface of a metal sheet and via holes for diffusing heat are formed so as to reach the metal sheet from a reverse surface.

FIG. 10 shows an embodiment in which the protrusion portion for mounting a semiconductor a chip is formed on one surface of a metal sheet, at least one of a prepreg, a resin sheet, a coating and a metal foil with a resin is disposed on one of the two surfaces of the metal sheets, at least one of a prepreg, a resin sheet, a coating and a metal foil with a resin is disposed on the other of the two surfaces of the metal sheets, and a metal foil is disposed on the resin layer having no metal foil. The resultant set is laminate-formed under heat and pressure to prepare a metal-foil-clad laminate, and a via hole for heat diffusion is formed in the metal sheet from the reverse surface so as to reach the metal sheet. The formed via hole is filled with a metal by metal plating.

According to the present invention, there is provided a semiconductor plastic package which is structured so as to release generated heat through the metal sheet, which is excellent in heat diffusibility and is free of absorption of moisture from below a semiconductor chip and which therefore permits a remarkable decrease in the occurrence of the popcorn phenomenon, and there is also provided a process for the production thereof. According to the present invention, further, there are provided a semiconductor plastic package suitable for mass production and excellent in economic performance, and a process for the production thereof.

EXAMPLES

The present invention will be explained more specifically with reference to Examples hereinafter, in which "part" stands for "part by weight" unless otherwise specified.

Example 1

900 parts of 2,2-bis(4-cyanatophenyl)propane and 100 parts of bis(4-meleimidephenyl)methane were melted at 150° C. and allowed to react for 4 hours with stirring, to prepare a prepolymer. The prepolymer was dissolved in mixed solvents of methyl ethyl ketone and at i dimethylformamide. To this were added 400 parts of a bisphenol A type epoxy resin (trade name: Epikote 1001, supplied by Yuka-Shell Epoxy K.K.) and 600 parts of a cresol novolak type epoxy resin (trade name: ESCN-220F, supplied by Sumitomo Chemical Co., Ltd.), and these materials were homogeneously dissolved and mixed. Further, as a catalyst, 0.4 part of zinc octylate was added, and these materials were dissolved and mixed. To the resultant mixture was added 500 parts of an inorganic filler (trade name: Talc P-3, supplied by Nippon Talc K.K.), and these materials were homogeneously stirred and mixed to prepare a varnish A.

The above varnish was used to impregnate a 100 $\mu$m thick glass woven fabric, and the impregnated glass woven fabric was dried at 150° C. to prepare a 105 $\mu$m thick semi-cured low-flow prepreg (prepreg B1) having a gelation time of 0 seconds at 170° C. and a resin flow of 60 $\mu$m at 170° C. at 20 kgf/cm$^2$ for 5 minutes.

Further, the same impregnated glass woven fabric was dried at 145° C. to prepare a 107 $\mu$m thick semi-cured high-flow prepreg (prepreg C1) having a gelation time of 120 seconds at 170° C. and a resin flow of 13 mm.

On the other hand, an alloy having a thickness of 200 $\mu$m and containing Cu: 97.3%, Fe: 2.5%, P: 0.1%, Zn: 0.07% and Pb: 0.03% was provided for an inner layer metal sheet, and a protrusion portion having a 13×13 mm square size and a height of 100 $\mu$m was formed by an etching method so as to be positioned in the center of a package having a 50×50 mm square size.

Then, a liquid etching resist was applied to the entire surface of the above metal sheet to form a coating having a thickness of 25 μm, and the coating was dried to remove the solvents. A negative film having a hole for the protrusion portion was placed thereon, and a negative film was placed on the entire lower side the metal sheet. Portions other than a clearance hole were exposed to ultraviolet light, and the resist film of a clearance hole portion was removed with a 1% sodium carbonate aqueous solution. Then, a clearance hole having a diameter of 0.6 mm was made by etching on both sides.

The entire surface of the metal sheet was treated to form black copper oxide, and the above prepreg B having a hole greater than the protrusion portion by 50 μm made by punching was used to cover the upper surface thereof The prepreg C was used to cover on the lower surface. Electrolytic copper foils having a thickness of 18 μm were placed on both of the prepregs, and the resultant set was laminate-formed at 200° C. at 20 kgf/cm² at a vacuum of 30 mmHg or less for 2 hours to integrate them.

In the clearance hole portion, a through-hole having a diameter of 0.25 mm was made in the center thereof with a laser so as not to be brought into contact with the inner layer metal sheet of the clearance hole portion. Through-holes having a diameter of 0.25 mm each were drilled in four corners so as to be in direct contact with the metal sheet as heat-diffusible portions. After desmear treatment, copper plating was carried out by electroless plating and electric plating to form a 18 μm thick copper plating layer in the holes.

A liquid etching resist was applied to the front and reverse surfaces and dried, and then positive films were placed thereon, followed by exposure, development and the formation of front and reverse circuits. At the same time, the copper foil on the protrusion portion was removed together by etching. A plating resist was formed on portions other than the protrusion portion, a bonding pad portion and a ball pad portion, and plating was carried out with nickel and gold, to complete a printed circuit board.

A semiconductor chip. having a 13×13 mm square size was bonded and fixed to the protrusion portion with a silver paste, then, wire bonding was carried out. The resultant set was encapsulated with a silica-containing epoxy-sealing compound by transfer molding, to obtain a semiconductor package, and solder balls were attached. The semiconductor package was connected to a motherboard printed circuit board of an epoxy resin by melting the solder balls under heat. The resultant semiconductor plastic package was evaluated, and Table 1 shows the results.

Example 2

The same prepreg C1 in Example 1 was provided, a 18 μm thick electrolytic copper foil was placed on one surface, a release film was placed on the other surface, and the resultant set was laminate-formed at 200° C. at 20 kgf/cm² for 2 hours to prepare a single-side copper-clad laminate.

A rolling copper sheet for an inner layer, having a thickness of 200 μm, was processed in the same manner as in Example 1 to form a protrusion having the same size and the same height as those in Example 1. Further, a clearance hole having a diameter of 0.6 mm was made, repregs were similarly placed on the upper and lower surfaces, sheets of the above-obtained single-side copper-clad laminate were placed on both sides, and the resultant set was laminate-formed under the same conditions.

In the clearance hole portion, a through-hole having a diameter of 0.20 mm was drilled in the center thereof so as not to be brought into the metal sheet of the clearance hole portion. Through-holes were drilled in four corners so as to be in direct contact with the metal sheet as heat-diffusible portions. After desmear treatment, copper plating was carried out by electroless plating and electric plating to form a 17 μm thick copper plating layer in the holes.

A liquid etching resist was applied to the front and reverse surfaces and dried to remove the solvents, and then positive films were placed thereon, followed by exposure, development and the formation of front and reverse circuits. A plating resist was formed on portions other than the laminate portion on the protrusion portion, a bonding pad portion and a ball pad portion, plating was carried out with nickel and gold, and then the substrate of the laminate portion on the central copper sheet protrusion portion was removed by cutting with a router, to complete a printed circuit board.

Then, a semiconductor was bonded and followed by encapsulation with a resin in the same manner as in example 1, to form a semiconductor plastic package. The resultant semiconductor plastic package was evaluated, and Table 1 shows the results.

Comparative Example 1

Two sheets of prepregs which were the same as the high-flow prepreg C1 in Example 1 were used. Electrolytic copper foils were placed on upper and lower surfaces thereof, and the resultant set was laminate-formed at 190° C. at 20 kgf/cm² under vacuum for 90 minutes, to obtain a dual-side copper-clad laminate. A through-hole having a diameter of 0.25 mm was drilled in a predetermined position, and copper plating was carried out.

Figure 11:
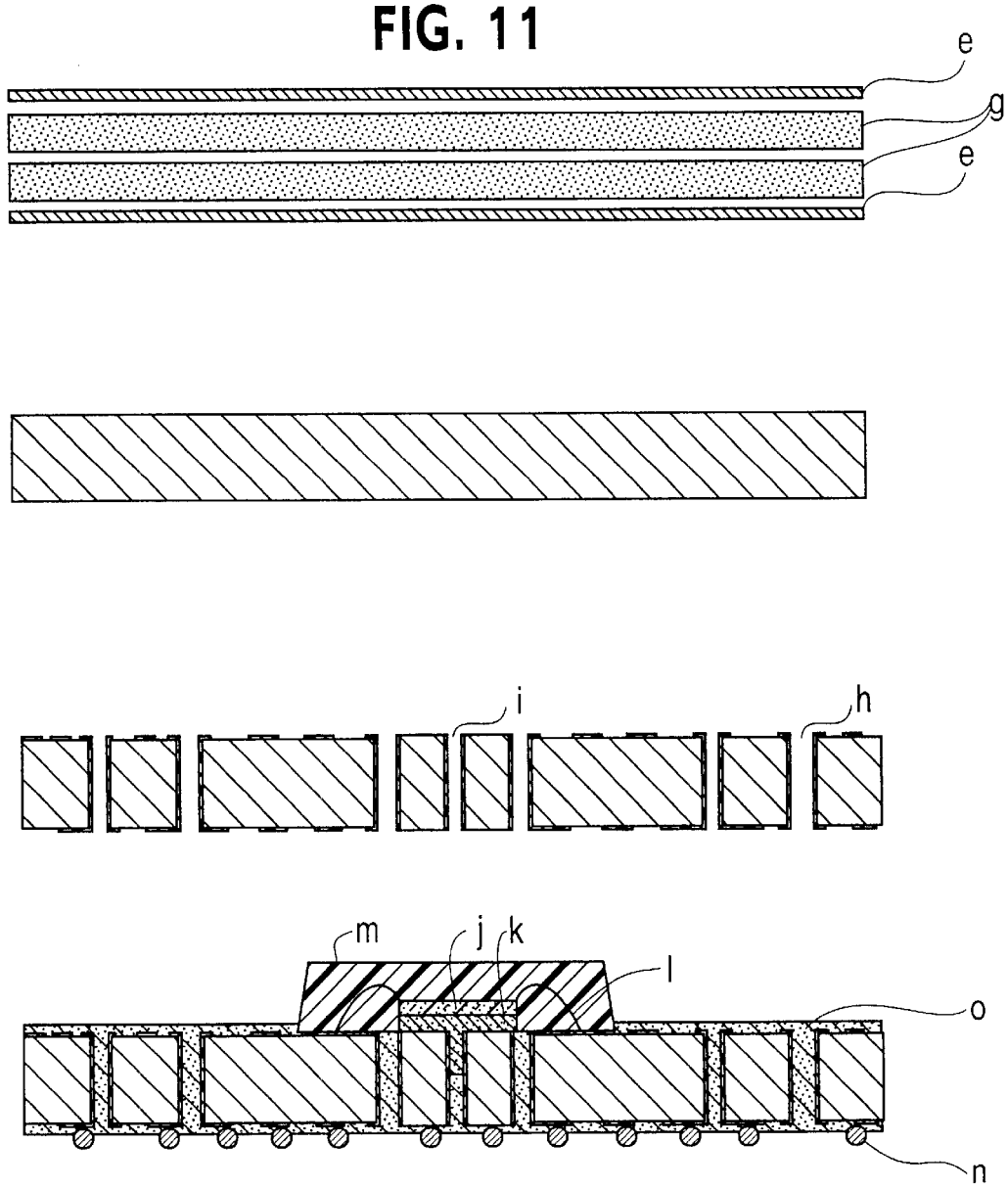
FIG. 11 schematically shows steps of producing a semiconductor plastic package in Comparative Example 1.

Circuits were formed on the upper and lower surfaces of the above laminate according to a known method, and nickel plating and gold plating were carried out. The through-hole for heat diffusion was formed in a portion where a semiconductor chip was to be mounted, a semiconductor chip was bonded thereon with a silver paste, and wire bonding was carried out, followed by encapsulation with a liquid sealing resin (FIG. 11). Solder balls were attached thereto, and the package was connected to a motherboard. The resultant semiconductor plastic package was evaluated, and Table 1 shows the results.

Comparative Example 2

The printed circuit board obtained in Comparative Example 1 was bored in a portion where the semiconductor chip was mounted, and then, a 200 μm thick copper sheet was bonded to the reverse surface thereof with a prepreg prepared by punching the above no-flow prepreg under heat and pressure, to prepare a heat-diffusing-sheet-attached printed circuit board.

Figure 12:
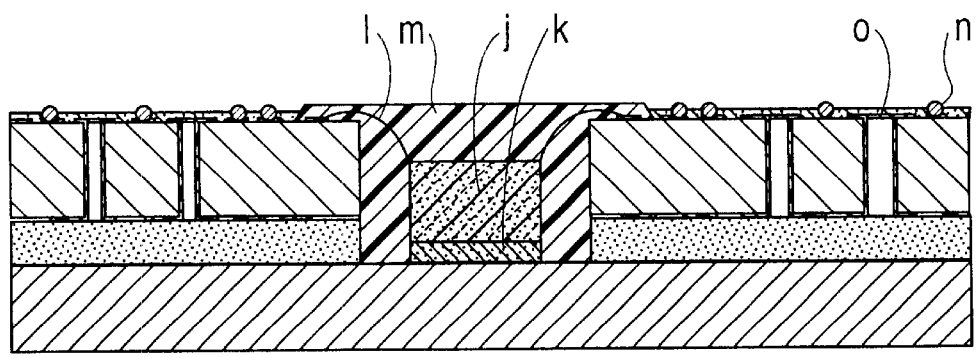
FIG. 12 schematically shows steps of producing a semiconductor plastic package in Comparative Example 2.

The above printed circuit board was slightly distorted. A semiconductor chip was bonded to the above heat-diffusing sheet with a silver paste, followed by wire bonding and encapsulation with a liquid sealing resin (FIG. 12). The resultant semiconductor plastic package was evaluated, and Table 1 shows the results.

Measurement methods in Examples including Examples to be described later were as shown below.

1) Heat resistance after moisture absorptions①: JEDEC STANDARD TEST METHOD A113-A LEVEL 3: After treatment at 30° C. at 60% RH for a predetermined period of time, and after 3 cycles of 220° C. reflow soldering, a substrate was evaluated for failures by observing its cross section and electric checking.

2) Heat resistance after moisture absorption②: JEDEC STANDARD TEST METHOD A113-A LEVEL 2: After treatment at 85° C. at 60% RH for a predetermined period of time (max. 168 hours), and after 3 cycles of 220° C. reflow soldering, a substrate was evaluated for failures by observing its cross section and electric checking.

3) Glass transition temperature: Measured by DMA method. 4) Insulation resistance value after treatment with pressure cooker: A sample was treated at 121° C. under two atmospheric pressures for a predetermined period of time and then treated at 25° C. at 60% RH for 2 hours, and then while 500 VDC was applied for 60 seconds, an insulation resistance value between terminals (line/space=70 μm/70 μm) was measured.

5) Migration resistance: At 85° C. and at 85% RH, 500 VDC was applied, and an insulation resistance value between terminals was measured.

TABLE 1

| | | Example 1 | Example 2 | CEx. 1 | CEx. 2 |
|---|---|---|---|---|---|
| Heat resistance after moisture absorption①  | Ordinary state | No failure | No failure | No failure | No failure |
| | 48 hours | No failure | No failure | No failure | No failure |
| | 96 hours | No failure | No failure | No failure | No failure |
| | 120 hours | No failure | No failure | No failure | No failure |
| | 144 hours | No failure | No failure | Partly peeled off | No failure |
| | 168 hours | No failure | No failure | ditto | Partly peeled off |
| Heat resistance after moisture absorption② | Ordinary state | No failure | No failure | No failure | No failure |
| | 24 hours | No failure | No failure | Partly peeled off | No failure |
| | 48 hours | No failure | No failure | Largely peeled off | Partly peeled off |
| | 72 hours | No failure | No failure | ditto | Largely peeled off |
| | 96 hours | No failure | No failure | Wire broken | ditto |
| | 120 hours | No failure | No failure | — | Wire broken |
| | 144 hours | No failure | No failure | — | — |
| | 168 hours | No failure | Partly peeled off | — | — |
| Tg | (° C.) | 234 | — | — | — |
| Insulation resistance (Ω) after pressure cooker test | Ordinary state | $5 \times 10^{14}$ | — | — | — |
| | 200 hours | $3 \times 10^{12}$ | | | |
| | 500 hours | $4 \times 10^{11}$ | | | |
| | 700 hours | $7 \times 10^{10}$ | | | |
| | 1000 hours | $1 \times 10^{10}$ | | | |
| Migration resistance (Ω) | Ordinary state | $6 \times 10^{13}$ | — | — | — |
| | 200 hours | $6 \times 10^{11}$ | | | |
| | 500 hours | $3 \times 10^{11}$ | | | |
| | 700 hours | $7 \times 10^{10}$ | | | |
| | 1000 hours | $6 \times 10^{10}$ | | | |

CEx. = Comparative Example
Tg = Glass transition temperature

Example 3

A varnish A was prepared in the same manner as in Example 1. A glass woven fabric having a thickness of 100 μm was impregnated with the above varnish A and dried at 150° C. to prepare a 105 m thick semi-cured low-flow prepreg (prepreg B2) having a gelation time of 7 seconds at 170° C. and a resin flow of 110 μm at 170° C. at 20 kgf/cm² for 5 minutes. Further, there was also prepared a 109 μm thick high-flow prepreg (prepreg C2) having a gelation time of 114 seconds and a resin flow of 13 mm.

A copper sheet having a thickness of 250 μm, which was to constitute an inner layer, was provided. A liquid etching resist was applied to the entire surface of the metal sheet to form a coating having a thickness of 20 μm, and the coating was dried to remove the solvents. Then, on the surface, the etching resist was left so as to leave a protrusion portion having a 8×8 mm square size in the center of the metal sheet having a 50×50 mm square size, and on the reverse surface, the etching resist was left on its entire surface, and only the upper surface of the copper sheet was etched to form a protrusion portion having a square-size area of 8×8 mm and a height of 100 μm for mounting a semiconductor chip. After the removal of the etching resist, a liquid etching resist was again applied to form a coating having a thickness of 20 μm, and the coating was dried. A negative film having a hole made for the metal protrusion portion was used to cover the surface, a negative film having no hole was used to cover the reverse surface, and after irradiation with ultraviolet light, resist film in a clearance hole portion was removed with a 1% sodium carbonate aqueous solution. Then, a clearance hole having a diameter of 0.6 mm was made by etching on both the surfaces.

Then, the entire surface of the metal sheet was treated to form black copper oxide, and the above prepreg B having a hole greater than the protrusion portion by 50 μm made by punching was covered on the upper surface thereof. The prepreg C was covered on the lower surface, electrolytic copper foils having a thickness of 12 μm were placed on both of them, and the resultant set was laminate-formed at 200° C. at 20 kgf/cm² at a vacuum of 30 mmHg or less for 2 hours to integrate them.

In the clearance hole portion, a through-hole having a diameter of 0.25 mm was drilled in the center thereof so as not to be brought into contact with the metal sheet of the clearance hole portion. Four heat-diffusing through-holes were drilled in four corners so as to be in direct contact with the metal sheet. After desmear treatment, copper plating was carried out by electroless plating and electric plating to form a 17 μm thick copper plating layer in the holes.

A liquid etching resist was applied to the front and reverse surfaces and dried, and then positive films were placed thereon, followed by exposure, development and the formation of front and reverse circuits. At the same time, the copper foil on the protrusion portion were removed together by etching. A plating resist was formed on portions other than the protrusion portion, a bonding pad portion and a ball pad portion, and plating was carried out with nickel and gold, to complete a printed circuit board. A semiconductor chip having a 13×13 mm square size was bonded and fixed to the protrusion portion with a silver paste, then, wire bonding was carried out, the resultant set was encapsulated with an epoxy-resin-based sealing compound, to obtain a semiconductor package, and solder balls were attached. The semiconductor package was connected onto a motherboard. The resultant semiconductor plastic package was evaluated, and Table 2 shows the results.

Example 4

One prepreg sheet which is the same as the prepreg C1 in Example 1 was used. A 18 μm electrolytic copper foil was placed on one surface, a release film was placed on the other surface, and the resultant set was laminate-formed at 200° C. at 20 kgf/cm² at a vacuum of 30 mmHg or less, to obtain a single-side copper-clad laminate. An alloy sheet containing Cu: 99.86 wt %, Fe: 0.11 wt % and P: 0.03 wt % was prepared and processed in the same manner as in Example 3 to form a protrusion portion having an area of 5×5 mm square size and a height of 100 μm. A clearance hole was made in the same manner. Then, the above prepreg B having a hole for the metal protrusion portion was placed on the upper surface, the above prepreg C was placed on the lower surface, the above single-side copper-clad laminate was placed on an outside thereof, and the resultant set was laminate-formed. Then, a printed circuit board was prepared. In the clearance hole portion, a through-hole having a diameter of 0.20 mm was drilled in the center thereof so as not to be brought into contact with the metal sheet of the clearance hole portion. Heat-diffusing through-holes were drilled so as to be in contact with the metal sheet. After desmear treatment, copper plating was carried out by electroless plating and electric plating to form a 18 μm thick copper plating layer in the holes.

A liquid etching resist was applied to the front and reverse surfaces and dried to remove the solvents, and then positive films were placed thereon, followed by exposure and development to form front and reverse circuits. A plating resist was formed on portions other than the protrusion portion for mounting a semiconductor chip, a bonding pad portion and a ball pad portion, and plating was carried out with nickel and gold. Substrate on the upper side of the metal protrusion portion was removed by cutting with a router to complete a printed circuit board. A semiconductor chip was bonded thereto with a silver paste, then, wire bonding was carried out. The resultant set was encapsulated with a resin and solder balls were attached, to obtain a semiconductor package. The semiconductor package was connected to a motherboard in the same manner as in Example 3. The resultant semiconductor plastic package was evaluated, and Table 2 shows the results.

Comparative Example 3

500 parts of an epoxy resin (trade name: Epikote 1045), 500 parts of an epoxy resin (trade name: ESCN220F), 300 parts of dicyandiamide and 2 parts of 2-ethylimidazole were dissolved in mixed solvents of methyl ethyl ketone and dimethylformamide, the resultant solution was used to impregnate a 100 μm thick glass woven fabric, to prepare a no-flow prepreg (prepreg D) having a gelation time of 10 seconds at 170° C. and a resin flow of 98 μm and a high-flow prepreg (prepreg E) having a gelation time of 150 seconds and a resin flow of 18 mm. Two sheets of the prepreg E were used, and a single-side copper-clad laminate was prepared by laminate-formation at 170° C. at 20 kgf/cm² at a vacuum of 30 mmHg for 2 hours. Thereafter, a printed circuit board was prepared in the same manner as in Comparative Example 1. A portion for mounting a semiconductor chip was bored with a boring machine, a 200 μm thick copper sheet was similarly bonded to the reverse surface with a prepreg prepared by punching out the above no-flow prepreg. D, under heat and pressure, to a heat-diffusing-sheet-attached printed circuit board. This board caused distortion to some extent. A semiconductor chip was directly bonded to the above heat-diffusing sheet with a silver paste, followed by wire bonding connection and encapsulation with a liquid epoxy resin. Solder balls were attached to the surface opposite to the metal-attached surface. The resultant semiconductor plastic package was similarly connected to a motherboard. The semiconductor plastic package was evaluated, and Table 2 shows the results.

TABLE 2

| | | Example 3 | Example 4 | CEx. 1–2 | CEx. 3 |
|---|---|---|---|---|---|
| Heat resistance After | Ord. state | No failure | No failure | No failure | No failure |
| | 24 hours | No failure | No failure | No failure | No failure |
| | 48 hours | No failure | No failure | No failure | No failure |
| moisture absorption① | 72 hours | No failure | No failure | No failure | No failure |
| | 96 hours | No failure | No failure | No failure | Partly peeled |
| | 120 hours | No failure | No failure | Partly peeled off | ditto |
| | 144 hours | No failure | No failure | ditto | ditto |
| | 168 hours | No failure | No failure | ditto | ditto |
| Heat resistance After moisture absorption② | Ord. state | No failure | No failure | No failure | No failure |
| | 24 hours | No failure | No failure | Partly peeled off | Partly peeled |
| | 48 hours | No failure | No failure | Largely peeled off | Largely peeled |
| | 72 hours | No failure | No failure | Wire broken | Wire broken |
| | 96 hours | No failure | No failure | Wire broken | Wire broken |
| | 120 hours | No failure | No failure | Wire broken | Wire broken |
| | 144 hours | No failure | No failure | — | — |
| | 168 hours | No failure | Partly peeled off | — | — |
| Tg | (° C.) | 234 | 235 | 234 | 145 |
| Insulation resistance (Ω) after pressure cooker test | Ord. state | $6 \times 10^{14}$ | $7 \times 10^{14}$ | $4 \times 10^{14}$ | $6 \times 10^{14}$ |
| | 200 hours | $6 \times 10^{12}$ | $4 \times 10^{12}$ | $5 \times 10^{12}$ | $2 \times 10^{8}$ |
| | 500 hours | $4 \times 10^{11}$ | $2 \times 10^{11}$ | $1 \times 10^{11}$ | $<10^{8}$ |
| | 700 hours | $4 \times 10^{10}$ | $4 \times 10^{10}$ | $3 \times 10^{10}$ | — |
| | 1000 hours | $2 \times 10^{10}$ | $1 \times 10^{10}$ | $8 \times 10^{9}$ | — |
| Migration resistance (Ω) | Ord. state | $5 \times 10^{13}$ | $6 \times 10^{12}$ | $6 \times 10^{12}$ | $6 \times 10^{12}$ |
| | 200 hours | $5 \times 10^{11}$ | $5 \times 10^{11}$ | $5 \times 10^{11}$ | $7 \times 10^{8}$ |
| | 500 hours | $4 \times 10^{11}$ | $3 \times 10^{11}$ | $2 \times 10^{11}$ | $<10^{8}$ |
| | 700 hours | $1 \times 10^{11}$ | $2 \times 10^{11}$ | $1 \times 10^{11}$ | — |
| | 1000 hours | $9 \times 10^{10}$ | $8 \times 10^{10}$ | $7 \times 10^{9}$ | — |
| Heat diffusibilty | (° C.) | 35 | 36 | 57 | 48 |

CEx. = Comparative Example
Ord. state = Ordinary state
Tg = Glass transition temperature

Example 5

A varnish A was prepared in the same manner as in Example 1.

A 100 μm thick glass woven fabric was impregnated with the varnish A, and the varnish A was dried at 150° C. to give a 105 μm thick semi-cured (prepreg B3) having a gelation time of 6 seconds at 170° C. and a resin flow of 110 μm at 170° C. at 20 kgf/cm² for 5 minutes. Further, there was also prepared a 109 μm thick prepreg (prepreg C2) having a gelation time of 114 seconds and a resin flow of 13 mm.

On the other hand, a copper sheet having a thickness of 250 μm was prepared for an inner layer metal sheet, and a protrusion portion having a 13×13 mm square size and a height of 100 μm was formed by an etching method so as to be positioned in the center of a package having a 50×50 mm square size.

Then, a liquid etching resist was applied to the entire surface of the above metal sheet to form a coating having a thickness of 20 μm, and the coating was dried to remove the solvents. Negative films having a hole for the protrusion portion were placed on both sides. Portions other than a slit portion were exposed to ultraviolet light, and the resist film of the slit portion was removed with a 1% sodium carbonate aqueous solution. Then, a slit having a width of 0.6 mm and a length of 10 mm was made by etching on both sides.

The entire surface of the metal sheet was treated to form black copper oxide, and a BT resin solvent-free hole-filling resin (trade name: BT S730, supplied by Mitsubishi Gas Chemical Co., Inc.) was filled in the above slit portion, and thermally cured at 120° C. for 40 minutes and at 160° C. for 60 minutes.

The above prepreg B has a hole which was made by a router and is greater than the protrusion portion by 50 μm was used to cover the upper surface thereof The prepreg C was used to cover the lower surface, electrolytic copper foils having a thickness of 18 μm were placed on both of them, and the resultant set was laminate-formed at 200° C. at 20 kgf/cm$^2$ at a vacuum of 30 mmHg or less for 2 hours to integrate them.

In the slit portion, a through-hole having a diameter of 0.25 mm was drilled in the center thereof so as not to be brought into contact with the metal of the slit portion. Through-holes for heat diffusion were drilled in four corners so as to be in direct contact with the inner layer metal sheet. After desmear treatment, copper plating was carried out by electroless plating and electric plating to form a 17 μm thick copper plating layer in the holes. A liquid etching resist was applied to the front and reverse surfaces and dried, and then positive films were placed thereon, followed by exposure and development to form front and reverse circuits. At the same time, the copper foil on the protrusion portion were removed together by etching, to obtain a printed circuit board. Then, plating was carried out with nickel and gold, to complete the printed circuit board.

A semiconductor chip having a 13×13 mm square size was bonded and fixed to the upper-surface protrusion portion with a silver paste. Then, wire bonding was carried out, and the semiconductor chip, wires and a bonding pad portion were encapsulated with a silica-containing epoxy-sealing compound by transfer molding, to obtain a semiconductor package. The resultant semiconductor package was evaluated, and Table 3 shows the results.

Example 6

A prepreg which is the same as the prepreg C1 in Example 1 was used. A 18 μm electrolytic copper foil was placed on one surface, a release film was placed on the other surface, and the resultant set was laminate-formed at 200° C. at 20 kgf/cm$^2$ for 2 hours to obtain a single-side copper-clad laminate.

An alloy sheet containing Cu: 99.86 wt %, Fe: 0.11 wt % and P: 0.03 wt % was provided for an inner layer, and it was processed in the same manner as in Example 5 to form two protrusion portions having a 10×10 mm square size and a height of 100 μm.

Further, a slit was made in the same manner as in Example 5. Then, the slit was filled with a resin, the prepreg B3 having holes made with a router for the protrusion portions was placed on the upper surface, the prepreg C2 was placed on the lower surface, the above obtained single-side copper-clad laminate sheets were placed on both sides, and the resultant set was laminate-formed in under the same conditions.

In the slit portion, a through-hole having a diameter of 0.20 mm was drilled in the center thereof so as not to be brought into contact with the metal of the slit portion. After desmear treatment, copper plating was carried out by electroless plating and electric plating to form a 17 μm thick copper plating layer in the hole. A plating resist was formed on portions other than laminate sheet portions on the protrusion portions, a bonding pad and a ball pad portion. The plating was carried out with nickel and gold. The substrate of the laminate sheet portion on the central copper sheet protrusion portion was removed by cutting with a router, to complete a printed circuit board. Then, similarly, a semiconductor chip was bonded, and then wire bonding was carried out, followed by encapsulation with a resin, to obtain a semiconductor package. The resultant semiconductor package was evaluated, and Table 3 shows the results.

TABLE 3

|  |  |  | Example 5 | Example 6 |
|---|---|---|---|---|
| Heat resistance after moisture absorption① | Ordinary state | | No failure | No failure |
| | 96 | hours | No failure | No failure |
| | 120 | hours | No failure | No failure |
| | 144 | hours | No failure | No failure |
| | 168 | hours | No failure | No failure |
| Heat resistance after moisture absorption② | Ordinary state | | No failure | No failure |
| | 24 | hours | No failure | No failure |
| | 48 | hours | No failure | No failure |
| | 72 | hours | No failure | No failure |
| | 96 | hours | No failure | No failure |
| | 120 | hours | No failure | No failure |
| | 144 | hours | No failure | No failure |
| | 168 | hours | No failure | Partly peeled off |
| Tg | (° C.) | | 234 | — |
| Insulation resistance (Ω) after pressure cooker test | Ordinary state | | 6 × 10$^{14}$ | — |
| | 200 | hours | 5 × 10$^{12}$ | |
| | 500 | hours | 4 × 10$^{11}$ | |
| | 700 | hours | 6 × 10$^{10}$ | |
| | 1000 | hours | 3 × 10$^{10}$ | |
| Migration resistance (Ω) | Ordinary state | | 4 × 10$^{13}$ | — |
| | 200 | hours | 5 × 10$^{11}$ | |
| | 500 | hours | 5 × 10$^{11}$ | |
| | 700 | hours | 8 × 10$^{10}$ | |
| | 1000 | hours | 3 × 10$^{10}$ | |
| Heat diffusibilty | (° C.) | | 38 | 39 |

Tg = Glass transition temperature

Example 7

A varnish A was prepared in the same manner as in Example 1. The varnish A was used to prepare a prepreg (prepreg B) which was the same as the prepreg B in Example 1. Further, there was also prepared a 109 μm thick prepreg C having a gelation time of 114 seconds and a reflow flow of 13 mm.

A 250 μm thick copper sheet was provided for an inner layer metal sheet, and one protrusion having a 13×13 mm square size and a height of 100 μm was formed so as to be present in the center of a package having a 50×50 mm square size.

A liquid etching resist was applied to the entire surface of the above metal sheet to form a coating having a thickness of 20 μm, and a clearance hole having a diameter of 0.6 mm was made in the same manner as in Example 1.

The entire surface of the metal sheet was treated to form black copper oxide, the prepreg B, the prepreg C and electrolytic copper foils were laminate-formed and integrated in the same manner as in Example 1.

Then, a through-hole was made in the same manner as in Example 1, and a 17 μm thick copper plating layer was formed in the hole.

A liquid etching resist was applied to the front and reverse surfaces and dried, and positive films were placed thereon, followed by exposure and development to form front and reverse circuits. At the same time, copper foil on the protrusion portion was concurrently removed by etching, to form a printed circuit board. Then, a hole which was 100 μm greater than the protrusion portion metal of the surface exposed metal portion, used for fixing a semiconductor chip, was made with a router, to prepare a prepreg B1. The prepreg B1 was placed on the above printed circuit board, a 18 μm thick electrolytic copper foil was also placed, and the resultant set was laminate-formed at 200° C. at 20 kgf/cm² under vacuum.

Copper foil in a portion where a blind via hole was to be made was removed by etching, a hole was made with a carbon dioxide gas laser, and after desmear treatment, copper plating was carried out in the same manner as in Example 1. A plating resist was formed on portions other than the protrusion portion, a bonding pad and a ball pad, and plating with nickel and gold was carried out to complete the printed circuit board.

A semiconductor chip having a 13×13 mm square size was bonded and fixed to the above protrusion portion with a silver paste, wire bonding was carried out, and the semiconductor chip was encapsulated with a silica-containing epoxy sealing liquid resin, to obtain a semiconductor package. The resultant semiconductor package was evaluated, and Table 4 shows the results.

Example 8

A prepreg C1 was used, and a single-side copper-clad laminate was prepared in the same manner as in Example 1.

An alloy having a thickness of 250 μm and containing Cu: 99.86 wt %, Fe: 0.11 wt % and P: 0.03 wt %, which was to constitute an inner layer, ways processed in the same manner as in Example 1, to form two protrusions having a 10×10 mm square size and a height of 100 μm on the surface.

Further, a clearance hole having a diameter of 0.6 mm was made, prepreg B1 having holes made for the protrusion portions with a router was similarly placed on the front surface, prepreg C1 was placed on the reverse surface, and two sheets of the above-obtained single-side copper-clad laminate were placed on both sides, and the resultant set was laminate-formed under the same conditions.

In the clearance hole portion, a through-hole having a diameter of 0.20 mm was drilled in the center thereof so as not to be brought into contact with the metal of the clearance hole portion. After desmear treatment, copper plating was carried out by electroless plating and electric plating to form a 17 μm thick copper plating layer in the hole.

An etching resist was applied to the front and reverse surfaces and dried to remove the solvents, and then positive films were placed, followed by exposure and development, to form front and reverse circuits.

Then, laminate-formation was carried out with the prepreg B1 in the same manner as in Example 1, a via hole portion was similarly made, a plating resist was formed on portions other than laminate sheet portions on the protrusion portions, a bonding pad portion and a ball pad portion. Plating with nickel and gold was carried out, and substrate of the laminate sheet portions on the central copper sheet protrusion portions were removed with a router, to complete a printed circuit board. Then, similarly, a semiconductor chip was bonded, followed by wire bonding and encapsulation with a resin, to obtain a semiconductor package. The resultant semiconductor package was evaluated, and Table 4 shows the results.

TABLE 4

|  |  | Example 7 | Example 8 |
|---|---|---|---|
| Heat resistance after moisture Absorption① |  Ordinary state | No failure | No failure |
|  | 96 hours | No failure | No failure |
|  | 120 hours | No failure | No failure |
|  | 144 hours | No failure | No failure |
|  | 168 hours | No failure | No failure |
| Heat resistance after moisture absorption② | Ordinary state | No failure | No failure |
|  | 24 hours | No failure | No failure |
|  | 48 hours | No failure | No failure |
|  | 72 hours | No failure | No failure |
|  | 96 hours | No failure | No failure |
|  | 120 hours | No failure | No failure |
|  | 144 hours | No failure | Partly peeled off |
|  | 168 hours | No failure | Partly peeled off |
| Tg | (° C.) | 234 | — |
| Insulation resistance (Ω) after pressure cooker test | Ordinary state | $4 \times 10^{14}$ | — |
|  | 200 hours | $6 \times 10^{12}$ |  |
|  | 500 hours | $6 \times 10^{11}$ |  |
|  | 700 hours | $5 \times 10^{10}$ |  |
|  | 1000 hours | $2 \times 10^{10}$ |  |
| Migration resistance (Ω) | Ordinary state | $5 \times 10^{13}$ | — |
|  | 200 hours | $6 \times 10^{11}$ |  |
|  | 500 hours | $5 \times 10^{11}$ |  |
|  | 700 hours | $9 \times 10^{10}$ |  |
|  | 1000 hours | $6 \times 10^{10}$ |  |
| Heat diffusibilty | (° C.) | 37 | 38 |

Tg = Glass transition temperature

Example 9

A varnish A was prepared in the same manner as in Example 1. The varnish A was used to impregnate a 100 μm thick glass woven fabric and dried at 150° C. to obtain a 105 μm thick semi-cured low-flow prepreg (prepreg B2) having a gelation time of 7 seconds at 170° C. and a resin flow of 110 μm at 170° C. at 20 kgf/cm² for 5 minutes. Further, the same impregnated glass woven fabric was dried at 145° C. to obtain a 107 μm thick high-flow prepreg (prepreg C1) having a gelation time of 120 seconds at 170° C. and a resin flow of 13 mm.

The same metal sheet as that in Example 1 was prepared, and a protrusion portion having a 13×13 mm square size and a height of 100 μm was formed by an etching method so as to be positioned in the center of a package having a 50×50 mm square size. Then, a clearance hole having a diameter of 0.6 mm was made in the same manner as in Example 1. The entire surface of the metal sheet was treated to form black copper oxide, and the above prepreg B2 having a hole greater than the protrusion portion by 50 μm made by punching in a position corresponding to the protrusion portion was covered on the upper surface thereof. The prepreg C1 was covered on the lower surface, electrolytic copper foils having a thickness of 12 μm were placed on both of them, and the resultant set was laminate-formed at 200° C. at 20 kgf/cm² at a vacuum of 30 mmHg or less for 2 hours to integrate them, whereby a dual-side copper-clad laminate was obtained. In the clearance hole portion, a through-hole having a diameter of 0.25 mm was made in the center thereof with a laser so as not to be brought into contact with the metal sheet of the clearance hole portion. Four heat-diffusing through-holes having a diameter of 0.25 mm were made in four corners with a laser so as to be in direct contact with the metal sheet. After desmear treatment, copper plating was carried out by electroless plating and electric plating to form a 18 μm thick copper plating layer in the holes.

A liquid etching resist was applied to the front and reverse surfaces and dried, and then positive films were placed thereon, followed by exposure and development to form front and reverse circuits. At the same time, the resist film and the copper foil on the protrusion portion were removed together by etching. A plating resist was formed on portions other than the protrusion portion, a bonding pad and a ball pad, and plating was carried out with nickel and gold, to complete a printed circuit board.

A semiconductor chip having a 13×13 mm square size was bonded and fixed to the protrusion portion with a silver paste, then, wire bonding was carried out, the resultant set was encapsulated with a silica-containing epoxy sealing compound by transfer molding, and solder balls were attached, to obtain a semiconductor[ ]package. The semiconductor package was connected to an epoxy resin motherboard printed circuit board by melting the solder balls. The semiconductor plastic package was evaluated, and Table 5-shows the results.

Example 10

The same prepreg C1 in Example 1 was provided, a 12 μm thick electrolytic copper foil was placed on one surface of the prepreg, a release film was placed on the other surface, and the resultant set was laminate-formed at 200° C. at 20 kgf/cm² for 2 hours to prepare a single-side copper-clad laminate. A rolling copper sheet having a thickness of 200 μm, which was to constitute an inner layer, was processed in the same manner as in Example 1 to form a protrusion having the same size and the same height as those in Example 1. Further, a clearance hole having a diameter of 0.6 mm was made. The same varnish A as that in Example 1 was applied to the front and reverse surfaces by screen printing such that no resin adhered to the metal protrusion portion, and formed coatings were dried. The above application and the drying were alternately repeated three times each, to form a resin layer having a thickness of 105 μm. The resin layer on the front surface was adjusted to be in a low-flow state and had a gelation time of 5 to 10 seconds at 170° C., and the resin layer on the reverse surface was adjusted to be in a high-flow state and had a gelation time of 60 to 70 seconds. The above-obtained single-side copper-clad laminate sheets were placed on both sides thereof, and the resultant set was laminate-formed under the same conditions, to prepare a dual-side copper-clad laminate. In the clearance hole portion, a through-hole having a diameter of 0.20 mm was drilled in the center thereof so as not to be brought into the metal sheet of the clearance hole portion. Through-holes were similarly drilled in four corners so as to be in direct contact with the metal sheet as heat-diffusible portions. After desmear treatment, copper plating was carried out by electroless plating and electric plating to form a 17 μm thick copper plating layer in the holes. A liquid etching resist was applied to the front and reverse surfaces and dried to remove the solvents, and then positive films were placed thereon, followed by exposure and development to form front and reverse circuits. A plating resist was formed on portions other than the laminate portion on the protrusion portion, a bonding pad and a ball pad. The plating was carried out with nickel and gold, and then the substrate of the laminate portion on the central copper sheet protrusion portion was removed by cutting with a router, to complete a printed circuit board. The flowing of resin into the top of the metal protrusion portion removed by cutting with the router was found to be 20 μm or less. Further, the cross section of the clearance hole was found to be free of voids.

Then, a semiconductor was similarly bonded and followed by encapsulation with a resin, to form a semiconductor plastic package. The semiconductor package was similarly connected to an epoxy resin motherboard printed circuit board. The semiconductor plastic package was evaluated, and Table 5 shows the results.

Comparative Example 4

The same prepregs D and E as those in Comparative Example 3 were prepared. Two sheets of the prepreg E were used, and a dual-side copper-clad laminate was prepared by laminate formation at 170° C. at 20 kgf/cm² under a vacuum of 30 mmHg for 2 hours. Then, a printed circuit board was prepared in the same manner as in Comparative Example 1, a portion on which a semiconductor chip was to be mounted was bored, and a copper sheet having a thickness of 200 μm was bonded to the reverse surface with a prepreg prepared by punching the above prepreg D under heat and pressure, to obtain a heat-diffusing-sheet-attached printed circuit board. The board caused distortion to some extent. A semiconductor chip was directly bonded to the above heatdiffusing sheet with a silver paste, followed by wire bonding connection and encapsulation with a liquid epoxy resin. Solder balls were attached to the surface opposite to the metal-attached surface. The resultant semiconductor package was similarly connected to a motherboard. The semiconductor plastic package was evaluated, and Table 5 shows the results.

TABLE 5

| | | Example 9 | Example 10 | CEx. 4 |
|---|---|---|---|---|
| Heat resistance after moisture absorption① | Ord. state | No failure | No failure | No failure |
| | 24 hours | No failure | No failure | No failure |
| | 48 hours | No failure | No failure | No failure |
| | 72 hours | No failure | No failure | No failure |
| | 96 hours | No failure | No failure | Partly peeled off |
| | 120 hours | No failure | No failure | ditto |
| | 144 hours | No failure | No failure | ditto |
| | 168 hours | No failure | No failure | ditto |
| Heat resistance after moisture absorption② | Ord. state | No failure | No failure | No failure |
| | 24 hours | No failure | No failure | Partly peeled off |
| | 48 hours | No failure | No failure | Largely peeled off |
| | 72 hours | No failure | No failure | Wire broken |
| | 96 hours | No failure | No failure | Wire broken |
| | 120 hours | No failure | No failure | Wire broken |
| | 144 hours | No failure | No failure | — |
| | 168 hours | No failure | Partly peeled off | — |
| Tg | (° C.) | 234 | 235 | 145 |
| Insulation resistance (Ω) after pressure cooker test | Ord. state | $5 \times 10^{14}$ | $6 \times 10^{14}$ | $6 \times 10^{14}$ |
| | 200 hours | $5 \times 10^{12}$ | $5 \times 10^{12}$ | $2 \times 10^{8}$ |
| | 500 hours | $4 \times 10^{11}$ | $7 \times 10^{11}$ | $<10^{8}$ |
| | 700 hours | $6 \times 10^{10}$ | $1 \times 10^{10}$ | — |
| | 1000 hours | $1 \times 10^{10}$ | $8 \times 10^{9}$ | — |
| Migration resistance (Ω) | Ord. state | $5 \times 10^{13}$ | $6 \times 10^{12}$ | $6 \times 10^{12}$ |
| | 200 hours | $5 \times 10^{11}$ | $5 \times 10^{11}$ | $7 \times 10^{8}$ |
| | 500 hours | $4 \times 10^{11}$ | $3 \times 10^{11}$ | $<10^{8}$ |
| | 700 hours | $1 \times 10^{11}$ | $2 \times 10^{11}$ | — |
| | 1000 hours | $9 \times 10^{10}$ | $8 \times 10^{10}$ | — |
| Heat diffusibilty | (° C.) | 36 | 37 | 48 |

CEx. = Comparative Example
Ord. state = Ordinary state
Tg = Glass transition temperature Example 11

A varnish A was prepared in the same manner as in Example 1. The varnish A was used to impregnate a 100 μm thick glass woven fabric and dried at 150° C. to obtain a 150 μm thick semi-cured low-flow prepreg (prepreg B4) having a gelation time of 7 seconds at 170° C. and a resin flow of 110 μm at 170° C. at 20 kgf/cmz for 5 minutes. Further, the same impregnated glass woven fabric was dried at 145° C. to obtain a 107 μm thick high-flow prepreg (prepreg C1) having a gelation time of 120 seconds at 170° C. and a resin flow of 13 mm.

On the other hand, an alloy having a thickness of 200 μm and containing Cu: 97.3%, Fe: 2.5%, P: 0.1%, Zn: 0.07% and Pb: 0.03% was provided for an inner layer metal sheet, and a protrusion portion having a 13×13 mm square size and a height of 100 μm was formed by an etching method so as to be positioned in the center of a package having a 50×50 mm square size.

Then, black copper oxide treatment was carried out in the same manner as in Example 1, and prepregs and electrolytic copper foils were laminated, and the resultant set was laminate-formed under the same conditions as those in Example 1 to integrate them, whereby a dual-side copper-clad laminate was obtained.

A printed circuit board was completed in the same manner as in Example 1 except that a through-hole was drilled in a clearance hole portion.

A semiconductor chip having a 13×13 mm square size was bonded and fixed to the protrusion portion with a silver paste, then, wire bonding was carried out, the resultant set was encapsulated with a silica-containing epoxy sealing compound by transfer molding, and solder balls were attached, to obtain a semiconductor package. The semiconductor package was connected to an epoxy resin motherboard printed circuit board by melting the solder balls. The semiconductor plastic package was evaluated, and Table 6 shows the results.

Example 12

The same prepreg C1 in Example 1 was provided, a 12 μm thick electrolytic copper foil was placed on one surface of the prepreg, a release film was placed on the other surface, and the resultant set was laminate-formed at 200° C. at 20 kgf/cm² for 2 hours to prepare a single-side copper-clad laminate.

A rolling copper sheet having a thickness of 300 μm, which was to constitute an inner layer, was processed in the same manner as in Example 1 to form a protrusion having a 10×10 mm square size and a height of 150 μm. Further, a clearance hole having a diameter of 0.6 mm was made. The same varnish A as that in Example 1 was applied to the front and reverse surfaces by screen printing such that no resin adhered to the metal protrusion portion, and formed coatings were dried, to form resin layers on the front and reverse surfaces. The resin layer on the reverse surface being a high-flow resin layer having a thickness of 45 μm and having a gelation time of 125 seconds at 170° C. and the resin layer on the front surface being a low-flow resin layer having a thickness of 40 μm and having a gelation time of 10 to 20 seconds at 170° C.

A single-side copper-clad laminate which was prepared from the above-obtained single-side copper-clad laminate by making a hole greater than the protrusion portion by 40 μm in a position corresponding to the metal protrusion portion was placed on the front surface of the above metal sheet, the same single-side copper-clad laminate as that obtained above was placed on the reverse surface, and the resultant set was laminate-formed under the same conditions to prepare a dual-side copper-clad laminate. In the clearance hole portion, a through-hole having a diameter of 0.20 mm was drilled in the center thereof so as not to be brought into the metal sheet of the clearance hole portion. Through-holes were similarly drilled in four corners so as to be in direct contact with the metal sheet as heat-diffusible portions. After desmear treatment, copper plating was carried out by electroless plating and electric plating to form a 17 μm thick copper plating layer in the holes. A liquid etching resist was applied to the front and reverse surfaces and dried to remove the solvents, and then positive films were placed thereon, followed by exposure and development to form front and reverse circuits. A plating resist was formed on portions other than the laminate portion on the protrusion portion, a bonding pad and a ball pad. The plating was carried out with nickel and gold, to complete a printed circuit board.

Then, a semiconductor chip was similarly bonded and followed by encapsulation with a resin and attaching of solder balls, to form a semiconductor plastic package, The semiconductor package was similarly connected to an epoxy resin motherboard printed circuit board. The semiconductor plastic package was evaluated, and Table 6 shows the results.

Example 13

A varnish A was prepared in the same manner as in Example 1. A low-flow prepreg (prepreg B1) and the high-flow prepreg (prepreg C1) were prepared in the same manner as in Example 11.

On the other hand, an alloy containing Cu: 97.45%, Fe: 2.4%, P: 0.03% and Zn: 0.12% was provided for an inner layer metal sheet, and a protrusion portion having a 13×13 mm square size and a height of 220 μm was formed by an etching method so as to be positioned in the center of a package having a 50×50 mm square size.

Then, a clearance hole having a diameter of 0.6 mm was made in the same manner as in Example 1.

The entire surface of the metal sheet was treated to form black copper oxide, and the above prepreg B1 having a hole greater than the protrusion portion by 110 μm made by punching in a position corresponding to the protrusion portion was used to cover the upper surface thereof. The prepreg C was used to cover the lower surface. Further, electrolytic copper foils having a thickness of 12 μm were placed on both of the prepregs. The resultant set was laminate-formed to prepare a dual-side copper-clad laminate, a circuit was formed on one surface of the laminate, a slightly larger hole was made by punching in a portion on which a semiconductor chip was to be mounted, black copper oxide treatment was carried out, and the resultant laminate was placed on the surface such that the surface on which the circuit was formed faced downward. A copper foil having a thickness of 12 μm was placed on the prepreg on the reverse surface, and the resultant set was laminate-formed at 200° C. at 20 kgf/cm² at a vacuum of 30 mmHg or less for 2 hours to integrate them, whereby a double-side copper-clad laminate having the metal protrusion portion exposed on the surface was obtained.

In the clearance hole portion, a through-hole was drilled therein, and through-holes having a diameter of 0.2 mm were similarly drilled in four corners so as to be in direct contact with the metal sheet as heat-diffusible portions. After desmear treatment, copper plating was carried out by electroless plating and electric plating to form a 18 μm thick copper plating layer in the holes.

Front and reverse surface circuits were formed, and nickel and gold plating, etc., were carried out, in the same manner as in Example 1, to complete a printed circuit board. A semiconductor chip having a 13×13 mm square size was bonded and fixed to the protrusion portion with a silver paste, then, wire bonding was carried out. The resultant set was encapsulated with a silica-containing epoxy sealing compound by transfer molding, and solder balls were attached, to obtain a semiconductor package. The semiconductor package was connected to an epoxy resin motherboard printed circuit board by melting the solder balls. The semiconductor plastic package was evaluated, and Table 6 shows the results.

height of 100 $\mu$m so as to be positioned in the center of a package having a 50×50 mm square size and a clearance hole having a diameter of 0.6 mm. The clearance hole had almost the same diameters on the upper and lower surfaces.

After black copper oxide treatment of the metal sheet, the prepregs were placed, 12 $\mu$m thick electrolytic copper foils were also placed and laminate-formation for integration was carried out, in the same manner as in Example 1.

A through-hole was made in the laminate of the metal sheet in the same manner as in Example 1, and a 17 $\mu$m thick

TABLE 6

|   |   |   | Example 11 | Example 12 | Example 13 | Example 14 |
|---|---|---|---|---|---|---|
| Heat resistance after moisture absorption① | | Ordinary state | No failure | No failure | No failure | No failure |
| | 72 | hours | No failure | No failure | No failure | No failure |
| | 96 | hours | No failure | No failure | No failure | No failure |
| | 120 | hours | No failure | No failure | No failure | No failure |
| | 144 | hours | No failure | No failure | No failure | No failure |
| | 168 | hours | No failure | No failure | No failure | No failure |
| Heat resistance after moisture absorption② | | Ordinary state | No failure | No failure | No failure | No failure |
| | 24 | hours | No failure | No failure | No failure | No failure |
| | 48 | hours | No failure | No failure | No failure | No failure |
| | 72 | hours | No failure | No failure | No failure | No failure |
| | 96 | hours | No failure | No failure | No failure | No failure |
| | 120 | hours | No failure | No failure | No failure | No failure |
| | 144 | hours | No failure | No failure | No failure | No failure |
| | 168 | hours | No failure | No failure | No failure | No failure |
| Tg | | (° C.) | 233 | 235 | 234 | 234 |
| Insulation resistance ($\Omega$) after pressure cooker test | | Ordinary state | $5 \times 10^{14}$ | $6 \times 10^{14}$ | $6 \times 10^{14}$ | $4 \times 10^{14}$ |
| | 200 | hours | $6 \times 10^{12}$ | $6 \times 10^{12}$ | $6 \times 10^{12}$ | $6 \times 10^{12}$ |
| | 500 | hours | $3 \times 10^{11}$ | $5 \times 10^{11}$ | $5 \times 10^{11}$ | $5 \times 10^{11}$ |
| | 700 | hours | $7 \times 10^{10}$ | $1 \times 10^{10}$ | $6 \times 10^{10}$ | $8 \times 10^{10}$ |
| | 1000 | hours | $1 \times 10^{10}$ | $9 \times 10^{9}$ | $2 \times 10^{10}$ | $6 \times 10^{10}$ |
| Migration resistance ($\Omega$) | | Ordinary state | $7 \times 10^{13}$ | $8 \times 10^{12}$ | $6 \times 10^{13}$ | $5 \times 10^{13}$ |
| | 200 | hours | $5 \times 10^{11}$ | $4 \times 10^{11}$ | $4 \times 10^{11}$ | $6 \times 10^{11}$ |
| | 500 | hours | $4 \times 10^{11}$ | $3 \times 10^{11}$ | $3 \times 10^{11}$ | $5 \times 10^{11}$ |
| | 700 | hours | $2 \times 10^{11}$ | $2 \times 10^{11}$ | $2 \times 10^{11}$ | $9 \times 10^{10}$ |
| | 1000 | hours | $9 \times 10^{10}$ | $8 \times 10^{10}$ | $9 \times 10^{10}$ | $6 \times 10^{10}$ |
| Heat diffusibility | | (° C.) | 36 | 36 | 36 | 37 |

Tg = Glass transition temperature

Example 14

A varnish A was prepared in the same. manner as in Example 1. The varnish A was used to impregnate a 100 $\mu$m thick glass woven fabric and dried at 150° C. to obtain a 107 $\mu$m thick semi-cured low-flow prepreg (prepreg B5) having a gelation time of 7 seconds at 170° C. and a resin flow of 110 $\mu$m at 170° C. at 20 kgf/cm² for 5 minutes. Further, the same impregnated glass woven fabric was dried to obtain a 109 $\mu$m thick high-flow prepreg C2 having a gelation time of 114 seconds and a resin flow of 13 mm.

On the other hand, a copper sheet having a thickness of 200 $\mu$m, which was to constitute an inner layer, was provided, and a liquid etching resist was applied to the entire surface thereof to form a coating having a thickness of 20 $\mu$m. The coating was dried, and then the coated copper sheet was irradiated with ultraviolet light such that etching resist for a protrusion portion was left on the front surface and that etching resist for a clearance hole portion was removed on the reverse surface, followed by development with a 1% sodium carbonate aqueous solution. Then, etching was carried out concurrently on both surfaces at 1.0 kgf/cm² on the front surface and at 2.5 kgf/cm² on the reverse surface to form a protrusion having a 13×13 mm square size and a copper plating layer was formed in the hole in the same manner as in Example 1.

Front and reverse surface circuits were formed, and plating with nickel and gold were carried out, in the same manner as in Example 1, to complete a printed circuit board. A semiconductor chip having a 13×13 mm square size was bonded to the surface protrusion portion, and wire bonding and encapsulation with a resin were carried out, in the same manner as in Example 1, to prepare a semiconductor package. The semiconductor plastic package was evaluated, and Table 7 shows the results.

Comparative Example 5

The same inner layer metal sheet as that in Example 14 was etched on both the surfaces at a pressure of 2 kgf/cm². The resultant metal sheet had a clearance hole whose diameter on the front surface was 0.3 mm and whose diameter on the reverse surface was 0.6 mm, and the clearance hole was thus formed non-uniformly. When a hole having a diameter of 0.25 mm was made, 67% by number of the through-hole was in contact with the inner layer metal sheet.

Example 15

A varnish A was prepared in the same manner as in Example 1. The varnish A was used to impregnate a 100 μm thick glass woven fabric and dried at 150° C. to obtain a 105 μm thick semi-cured low-flow prepreg (prepreg B2) having a gelation time of 7 seconds at 170° C. and a resin flow of 110 μm at 170° C. at 20 kgf/cm² for 5 minutes. Further, the same impregnated glass woven fabric was dried to obtain a 109 μm thick high-flow prepreg C2 having a gelation time of 114 seconds and a resin flow of 13 mm.

On the other hand, a copper sheet having a thickness of 250 μm, which was to constitute an inner layer, was provided, and a liquid etching resist was applied to the entire surface thereof to form a coating having a thickness of 20 μm. The coating was dried to remove the solvents, and a negative film for leaving a clearance hole portion was placed and then irradiated with ultraviolet light. Resist film on the clearance hole portion was removed with a 1% sodium carbonate aqueous solution. Then, etching was carried out on both surfaces to make a clearance hole having a diameter of 0.6 mm. Then, embossing was carried out under pressure applied to the lower surface, to form a protrusion having a 13×13 mm square size and a height of 100 μm so as to be positioned in the center of a package having a 50×50 mm square size. The copper sheet had a structure in which the lower surface was dented.

Black copper oxide treatment of the metal sheet was carried out, the prepregs were placed, 8 μm thick electrolytic copper foils were also placed and laminate-formation for integration was carried out, in the same manner as in Example 1. A through-hole was made in the clearance hole portion in the same manner as in Example 1 except that the through-hole was drilled, and a 17 μm thick copper plating layer was formed in the hole.

Front and reverse surface circuits were formed, and plating with nickel and gold were carried out, in the same manner as in Example 1, to complete a printed circuit board. A semiconductor chip having a 13×13 mm square size was bonded to the surface protrusion portion, and wire bonding and encapsulation with a resin were carried out, in the same manner as in Example 1, to prepare a semiconductor package. Further, solder balls were attached, and the semiconductor package was bonded onto an epoxy resin motherboard printed circuit board by heating and melting the solder balls. The semiconductor plastic package was evaluated, and Table 7 shows the results.

Example 16

An alloy having a thickness of 250 μm and containing Cu: 99.86 wt %, Fe: 0.11 wt % and P: 0.03 wt %, which was to constitute an inner layer, was provided and processed in the same manner as in Example 1, to make a clearance hole, and four protrusions having a 4×4 mm square size and a height of 100 μm each were formed on the surface. The reverse surface was dented. Further, a clearance hole having a diameter of 0.6 mm was made in the same manner as in Example 1. Prepregs were placed on the metal sheet, and 12 μm thick electrolytic copper foils were placed on both sides, in the same manner as in Example 1, and the resultant set was laminate-formed under the same conditions as those in Example 1. A through-hole having a diameter of 0.20 mm was drilled in the center so as not to be in contact with the metal of the clearance hole portion. For heat-diffusible portions, through-holes having the same diameters were drilled so as to be in contact with the metal sheet. After desmear treatment, copper plating was carried out by electroless plating and electric plating to form a 17 μm thick copper plating layer in the holes. Front and reverse surface circuits were formed, and plating with nickel and gold were carried out, in the same manner as in Example 1, to complete a printed circuit board. Semiconductor chips were bonded thereto, and wire bonding and encapsulation with a resin were carried out, in the same manner as in Example 1, to form a semiconductor package. The semiconductor package was similarly bonded to a motherboard. The semiconductor plastic package was evaluated, and Table 7 shows the results.

TABLE 7

|  |  | Example 15 | Example 16 |
|---|---|---|---|
| Heat resistance after moisture absorption① | Ord. state | No failure | No failure |
|  | 24 hours | No failure | No failure |
|  | 48 hours | No failure | No failure |
|  | 72 hours | No failure | No failure |
|  | 96 hours | No failure | No failure |
|  | 120 hours | No failure | No failure |
|  | 144 hours | No failure | No failure |
|  | 168 hours | No failure | No failure |
| Heat resistance after moisture absorption② | Ord. state | No failure | No failure |
|  | 24 hours | No failure | No failure |
|  | 48 hours | No failure | No failure |
|  | 72 hours | No failure | No failure |
|  | 96 hours | No failure | No failure |
|  | 120 hours | No failure | No failure |
|  | 144 hours | No failure | No failure |
|  | 168 hours | No failure | No failure |
| Tg | (° C.) | 235 | 234 |
| Insulation resistance (Ω) after pressure cooker test | Ord. state | $5 \times 10^{14}$ | $6 \times 10^{14}$ |
|  | 200 hours | $5 \times 10^{12}$ | $7 \times 10^{12}$ |
|  | 500 hours | $3 \times 10^{11}$ | $2 \times 10^{11}$ |
|  | 700 hours | $3 \times 10^{10}$ | $5 \times 10^{10}$ |
|  | 1000 hours | $2 \times 10^{10}$ | $1 \times 10^{10}$ |
| Migration resistance (Ω) | Ord. state | $4 \times 10^{13}$ | $5 \times 10^{12}$ |
|  | 200 hours | $4 \times 10^{11}$ | $5 \times 10^{11}$ |
|  | 500 hours | $6 \times 10^{11}$ | $3 \times 10^{11}$ |
|  | 700 hours | $9 \times 10^{10}$ | $1 \times 10^{11}$ |
|  | 1000 hours | $8 \times 10^{10}$ | $8 \times 10^{10}$ |
| Heat diffusibilty | (° C.) | 36 | 37 |

Ord. state = Ordinary state
Tg = Glass transition temperature

Example 17

A varnish A was prepared in the same manner as in Example 1.

The varnish A was used to impregnate a 100 μm thick glass woven fabric, and the impregnated fabric was dried at 150° C. to obtain a 105 μm thick semicured prepreg (prepreg B6) having a gelation time of 10 seconds at 170° C. and a resin flow of 85 μm at 170° C. at 20 kgf/cm² for 5 minutes.

A 250 μm thick copper sheet which was to constitute an inner layer metal sheet was provided. A protrusion having a 13×13 mm square size and a height of 100 μm was formed on one surface of the copper sheet, and a protrusion having a 13×13 mm square size and a height of 100 μm was formed on the other surface of the copper sheet, by an etching method so as to be positioned in the center of a package having a 50×50 mm square size.

Then, a liquid etching resist was applied to the entire surface to form a coating having a thickness of 25 μm, and the coating was dried to remove the solvents. Negative films having holes for the protrusion portions were placed on both sides, and portions other than a clearance hole portion were exposed to ultraviolet light, and the resist film on the clearance hole portion was removed with a 1% sodium carbonate aqueous solution. Then, a clearance hole having a diameter of 0.6 mm was made by etching on both sides.

The entire surface of the metal sheet was treated to form black copper oxide, sheets of the above prepreg B having a hole greater than the protrusion portion by 50 μm made in portions corresponding to the protrusion portions with a router were covered on both the surfaces, 18 μm thick electrolytic copper foils were placed on both sides, and the resultant set was laminate-formed at 200° C. at 20 kgf/cm² under a vacuum of 30 mmHg or less for 2 hours to integrate them.

In the clearance hole portion, a through-hole having a diameter of 0.25 mm was made in the center with a laser so as not to be in contact with the metal of the clearance hole portion. After desmear treatment, copper plating was carried out by electroless plating and electric plating to form a 17 μm thick copper plating layer in the hole.

A liquid etching resist was applied to the front and reverse surfaces and dried, and positive films were placed, followed by exposure and development to form front and reverse surface circuits. Copper foil on the protrusion portions was also simultaneously removed by etching.

A plating resist was formed on portions other than the protrusion portions, a bonding pad and a ball pad, and plating was carried out with nickel and gold, to complete a printed circuit board.

Then, a semiconductor chip having a 13×13 mm square size was bonded and fixed to the upper surface protrusion with a silver paste, wire bonding was carried out, then, the resultant set was encapsulated with a silica-containing epoxy sealing compound by transfer molding, and solder balls were attached to a ball pad, to obtain a semiconductor package (FIG. 7). The semiconductor package was connected to an epoxy resin mother board printed circuit board by melting the solder balls. The semiconductor plastic package was evaluated, and Table 8 shows the results.

Example 18

One sheet of the same prepreg B6 as that obtained in Example 17 was used, a 18 μm thick electrolytic copper foil was placed on one surface, a release film was placed on the other surface, and the resultant set was laminate-formed at 200° C. at 20 kgf/cm² for 2 hours to prepare a single-side copper-clad laminate. A 250 μm thick alloy sheet containing Cu: 99.86 wt %, Fe: 0.11 wt % and P: 0.03 wt %, which was to constitute an inner layer, was provided and processed in the same manner as in Example 17, to form protrusions having the same size and the same height as those in Example 17. Further, a clearance hole having a diameter of 0.6 mm was made, and prepregs B6 were similarly placed on both upper and lower sides. The above-obtained single-side copper-clad laminate sheets were placed on both sides, and the resultant set was laminate-formed under the same conditions. In the clearance hole portion, a through-hole having a diameter of 0.20 mm was drilled in the center so as not to be in contact with the metal of the clearance hole portion. After desmear treatment, copper plating was carried out by electroless plating and electric plating to form a 17 μm thick copper plating layer in the hole.

A liquid etching resist was applied to the front and reverse surfaces and dried to remove the solvents, and positive films were placed, followed by exposure and development to form front and reverse surface circuits.

A plating resist was formed on portions other than laminate sheet portions on the protrusion portions, a bonding pad and a ball pad. Plating was carried out with nickel and gold, and substrate of the laminate sheet portions on the central copper alloy sheet protrusion portions was removed by cutting with a router, to complete a printed circuit board. Then, a semiconductor chip was similarly bonded and fixed, followed by encapsulation with a resin and attaching of solder balls, to obtain a semiconductor plastic package. The semiconductor package was connected to a motherboard printed circuit board in the same manner as in Example 17. The semiconductor plastic package was evaluated, and Table 8 shows the results.

TABLE 8

|  |  |  | Example 17 | Example 18 |
|---|---|---|---|---|
| Heat resistance | Ordinary state |  | No failure | No failure |
| after moisture Absorption ① | 120 hours | | No failure | No failure |
| | 144 hours | | No failure | No failure |
| | 168 hours | | No failure | No failure |
| Heat resistance | Ordinary state | | No failure | No failure |
| after moisture absorption ② | 24 hours | | No failure | No failure |
| | 48 hours | | No failure | No failure |
| | 72 hours | | No failure | No failure |
| | 96 hours | | No failure | No failure |
| | 120 hours | | No failure | No failure |
| | 144 hours | | No failure | No failure |
| | 168 hours | | No failure | Partly peeled |
| Tg | (° C.) | | 235 | — |
| Insulation resistance (Ω) after pressure cooker test | Ord. state | | $4 \times 10^{14}$ | — |
| | 200 hours | | $4 \times 10^{12}$ | |
| | 500 hours | | $5 \times 10^{11}$ | |
| | 700 hours | | $8 \times 10^{10}$ | |
| | 1000 hours | | $2 \times 10^{10}$ | |
| Migration resistance (Ω) | Ord. state | | $5 \times 10^{13}$ | |
| | 200 hours | | $5 \times 10^{11}$ | |
| | 500 hours | | $3 \times 10^{11}$ | |
| | 700 hours | | $1 \times 10^{11}$ | |
| | 1000 hours | | $8 \times 10^{10}$ | |
| Heat diffu-sibilty | (° C.) | | 32 | 35 |

Tg = Glass transition temperature

Example 19

A varnish A was prepared in the same manner as in Example 1. The varnish A was used to impregnate a 100 μm thick glass woven fabric, and the impregnated fabric was dried at 150° C. to obtain a 105 μm thick semi-cured prepreg (prepreg B2) having a gelation time of 7 seconds at 170° C. and a resin flow of 110 μm at 170° C. at 20 kgf/cm² for 5 minutes. Further, there was also prepared a 109 μm thick prepreg C2 having a gelation time of 114 seconds and a resin flow of 13 mm.

A 250 μm thick copper sheet which was to constitute an inner layer metal sheet was provided. A protrusion having a 13×13 mm square size and a height of 100 μm was formed on one surface so as to be positioned in the center of a package having a 50×50 m square size, and protrusions having a width of 5 mm and a height of 100 μm were formed in marginal portions on the front and reverse surfaces. A clearance hole having a diameter of 0.6 mm was made in the same manner as in Example 19 except that the thickness of an etching resist was changed to 20 μm. The entire surface of the metal sheet was treated to form black copper oxide, and the above low-flow prepreg B having holes greater than the protrusion portions by 50 μm made in portions corresponding to the protrusion portions with a router was covered on the front surface. The high-flow prepreg C having a hole greater than a heat-diffusing protrusion portion by 100 μm was covered on the reverse surface, and 18 μm thick electrolytic copper foils were placed on both sides. The resultant set was laminate-formed at 200° C. at 20 kgf/cm² under a vacuum of 30 mmHg or less for 2 hours to integrate them.

In the clearance hole portion, a through-hole having a diameter of 0.25 mm was drilled in the center so as not to be in contact with the metal of the clearance hole portion. After desmear treatment, copper plating was carried out by electroless plating and electric plating to form a 17 μm thick copper plating layer in the hole. A liquid etching resist was applied to the front and reverse surfaces and dried, and positive films were placed, followed by exposure and development to form front and reverse surface circuits. Copper foil on the protrusion portions was also simultaneously removed by etching, to create a printed circuit board. A plating resist was formed on portions other than the protrusion portions, a bonding pad and a ball pad, and plating was carried out with nickel and gold, to complete the printed circuit board.

Then, a semiconductor chip having a 13×13 mm square size was bonded and fixed to the upper surface protrusion with a silver paste, wire bonding was carried out, then, the resultant set was encapsulated with a silica-containing epoxy sealing compound by transfer molding, and solder balls were attached, to obtain a semiconductor package (FIG. 9). The semiconductor package was connected to a mother board printed circuit board by melting the solder balls under heat. The semiconductor plastic package was evaluated, and Table 9 shows the results.

Example 20

One sheet of the same prepreg B2 as that obtained in Example 19 was used. A 18 μm thick electrolytic copper foil was placed on one surface, a release film was placed on the other surface, and the resultant set was laminate-formed at 200° C. at 20 kgf/cm² for 2 hours to prepare a single-side copper-clad laminate.

A 250 μm thick alloy sheet containing Cu: 99.86 wt %, Fe: 0.11 wt % and P: 0.03 wt %, to constitute an inner layer, was provided and processed in the same manner as in Example 19, to form two protrusions having the same size and the same height as those in Example 19 and protrusions having a width of 5 mm and a height of 100 μm in marginal portions on the front and reverse surfaces. Further, a clearance hole having a diameter of 0.6 mm was made, and the prepreg B having holes for the protrusion portions was placed on the upper surface, and the prepreg C having a hole in a position corresponding to a heath diffusing protrusion portion was placed on the reverse surface. The above-obtained single-side copper-clad laminate sheets were placed on both sides, and the resultant set was laminate-formed under the same conditions. In the clearance hole portion, a through-hole having a diameter of 0.20 mm was drilled in the center so as not to be in contact with the metal of the clearance hole portion. After desmear treatment, copper plating was carried out by electroless plating and electric plating to form a 17 μm thick copper plating layer in the hole. A liquid etching resist was applied to the front and reverse surfaces and dried to remove the solvents, and positive films were placed, followed by exposure and development to form front and reverse surface circuits. A plating resist was formed on portions other than bonding pad and ball pad portions. Plating was carried out with nickel and gold, and substrate of the laminate sheet portions on the central copper alloy sheet protrusion portions was removed by cutting with a router, to complete a printed circuit board.

Then, a semiconductor chip was similarly bonded and fixed, followed by encapsulation with a resin and attaching of solder balls, to obtain a semiconductor plastic package. The semiconductor package was connected to a motherboard printed circuit board in the same manner as in Example 19. The semiconductor plastic package was evaluated, and Table 9 shows the results.

TABLE 9

| | | | Example 19 | Example 20 |
|---|---|---|---|---|
| Heat resistance after moisture Absorption ① | Ordinary state | | No failure | No failure |
| | 24 hours | | No failure | No failure |
| | 48 hours | | No failure | No failure |
| | 72 hours | | No failure | No failure |
| | 96 hours | | No failure | No failure |
| | 120 hours | | No failure | No failure |
| | 144 hours | | No failure | No failure |
| | 168 hours | | No failure | No failure |
| Heat resistance after moisture Absorption ② | Ordinary state | | No failure | No failure |
| | 24 hours | | No failure | No failure |
| | 48 hours | | No failure | No failure |
| | 72 hours | | No failure | No failure |
| | 96 hours | | No failure | No failure |
| | 120 hours | | No failure | No failure |
| | 144 hours | | No failure | No failure |
| | 168 hours | | No failure | No failure |
| Tg | (° C.) | | 234 | — |
| Insulation resistance (Ω) after pressure cooker test | Ordinary state | | $3 \times 10^{14}$ | — |
| | 200 hours | | $5 \times 10^{12}$ | |
| | 500 hours | | $5 \times 10^{11}$ | |
| | 700 hours | | $8 \times 10^{10}$ | |
| | 1000 hours | | $4 \times 10^{10}$ | |
| Migration resistance (Ω) | Ord. state | | $5 \times 10^{13}$ | — |
| | 200 hours | | $4 \times 10^{11}$ | |
| | 500 hours | | $5 \times 10^{11}$ | |
| | 700 hours | | $9 \times 10^{10}$ | |
| | 1000 hours | | $8 \times 10^{10}$ | |
| Heat diffusibilty | (° C.) | | 30 | 31 |
| Temperature cycle test | 100 cycles | | No failure | No failure |
| | 300 cycles | | No failure | No failure |
| | 500 cycles | | No failure | Partly peeled off |

Tg = Glass transition temperature

Example 21

A varnish A was prepared in the same manner as in Example 1. The varnish A was used to impregnate a 100 μm thick glass woven fabric, and the impregnated fabric was dried at 150° C. to obtain a 105 μm thick semi cured prepreg (prepreg B2) having a gelation time of 7 seconds at 170° C. and a resin flow of 110 dun at 170° C. at 20 kgf/cm² for 5 minutes. Further, there was also prepared a 109 μm thick prepreg C2 having a gelation time of 114 seconds and a resin flow of 13 mm.

A 250 μm thick copper sheet which was to constitute an inner layer metal sheet was provided. A protrusion having a 13×13 mm square size and a height of 100 μm was formed on one surface of the copper sheet so as to be positioned in the center of a package having a 50×50 mm square size, and a protrusion having a width, of 5 mm and a height of 100 μm was formed in a marginal portion on the lower surface. Then, a semiconductor package was prepared in the same manner as in Example 19. Solder balls were attached to a ball pad of the package, and the semiconductor package was connected to an epoxy resin motherboard printed circuit board by melting the solder balls under heat. The semiconductor plastic package was evaluated, and Table 10 shows the results.

Example 22

One sheet of the same prepreg B2 as that obtained in Example 21 was used. A 18 μm thick electrolytic copper foil was placed on one surface, a release film was placed on the other surface, and the resultant set was laminate formed at 200° C. at 20 kgf/cm² for 2 hours to prepare a single-side copper-clad laminate.

A 250 μm thick alloy sheet containing Cu: 99.86 wt %, Fe: 0.11 wt % and P: 0.03 wt %, to constitute an inner layer, was provided and processed in the same manner as in Example 21, to form two protrusions having the same size and the same height as those in Example 19 and a protrusion having a width of 5 mm and a height of 100 μm in a marginal portion on the lower surface.

A clearance hole was made, a through-hole was made, plating with copper in the through-hole, and front and reverse surface circuits were formed, in the same manner as in Example 20.

A plating resist was formed on portions other than the substrate portion on which a semiconductor chip was to be mounted, a bonding pad portion, a ball pad portion and a heat-diffusing-metal exposed portion on the lower (reverse) surface. Plating was carried out with nickel and gold, and substrate of the laminate sheet portion on the copper sheet protrusion portion was removed by cutting with a router, to complete a printed circuit board. Then, a semiconductor chip was bonded, wire bonding was carried out, and the resultant set was encapsulated with a resin to form a semiconductor package. The semiconductor package was connected to a motherboard printed circuit board with solder balls in the same manner as in Example 21. The semiconductor plastic package was evaluated, and Table 10 shows the results.

TABLE 10

| | | Example 21 | Example 22 |
|---|---|---|---|
| Heat resistance after moisture Absorption ① | Ordinary state | No failure | No failure |
| | 24 hours | No failure | No failure |
| | 48 hours | No failure | No failure |
| | 72 hours | No failure | No failure |
| | 96 hours | No failure | No failure |
| | 120 hours | No failure | No failure |
| | 144 hours | No failure | No failure |
| | 168 hours | No failure | No failure |
| Heat resistance ② after moisture Absorption ① | Ordinary state | No failure | No failure |
| | 24 hours | No failure | No failure |
| | 48 hours | No failure | No failure |
| | 72 hours | No failure | No failure |
| | 96 hours | No failure | No failure |
| | 120 hours | No failure | No failure |
| | 144 hours | No failure | partly peeled off |
| | 168 hours | partly peeled off | partly peeled off |
| Tg | (° C.) | 234 | — |
| Insulation resistance (Ω) after pressure cooker treatment | Ordinary state | $3 \times 10^{14}$ | — |
| | 200 hours | $5 \times 10^{12}$ | |
| | 500 hours | $5 \times 10^{11}$ | |
| | 700 hours | $8 \times 10^{10}$ | |
| | 1000 hours | $4 \times 10^{10}$ | |
| Migration resistance (Ω) | Ord. state | $5 \times 10^{13}$ | — |
| | 200 hours | $4 \times 10^{11}$ | |
| | 500 hours | $5 \times 10^{11}$ | |
| | 700 hours | $9 \times 10^{10}$ | |
| | 1000 hours | $8 \times 10^{10}$ | |
| Heat diffusibility | (° C.) | 30 | 31 |
| Temperature cycle test | 100 cycles | No failure | No failure |
| | 300 cycles | No failure | No failure |
| | 500 cycles | No failure | Partly peeled off |

Tg = Glass transition temperature

Example 23

A varnish A was prepared in the same manner as in Example 1. The varnish A was used to impregnate a 100 μm thick glass woven fabric, and the impregnated fabric was dried to obtain a 140 μm thick semi-cured prepreg (prepreg B7) having a gelation time of 50 seconds at 170° C. and a resin flow of 10 mm at 170° C. at 20 kgf/cm² for 5 minutes. Further, here was also prepared a 126 μm thick prepreg C3 having a gelation time of 7 seconds and a resin flow of 95 μm.

A 100 μm thick alloy sheet containing Cu: 99.9 wt %, Fe: 0.07 wt % and P: 0.03 wt %, to constitute an inner layer, was provided. A liquid etching resist was applied to the upper and lower surfaces of the alloy sheet to form a coating having a thickness of 25 μm, and the coating was dried. Then, on the front surface, an etching resist having a 13×13 mm square size was left so as to be positioned in the center of a package having a 50×50 mm square size, and on the reverse surface, etching resist was left on its entire surface other than a clearance hole portion. A clearance hole having a 13×13 mm square size and a height of 120 μm was formed in the center of the surface by etching both sides. The entire surface of the metal sheet was treated to form black copper oxide. The prepreg C3 having a hole slightly greater than the metal protrusion portion made by punching was placed on the front surface, the above prepreg B7 was placed on the reverse surface, 12 μm thick electrolytic copper foils were placed on outsides thereof, and the resultant set was laminate formed at 200° C. at 20 kgf/cm² for 2 hours to fill the resin in the clearance hole portion and to integrate them.

In the through-hole portion, a through-hole having a diameter of 0.25 mm was drilled in the center so as not to be in contact with the metal core, and further, 625 holes having a diameter of 120 m were made in the reverse surface with a carbon dioxide gas laser such that the holes reached the metal core. Plasma surface treatment and desmear treatment were carried out, and then, copper plating was carried out, and the through-hole portion was plated with copper. Further, all the via holes on the reverse surface were also plated with copper to be filled. Then, circuits were formed on the front and reverse surfaces, and a plating resist was covered on portions other than the semiconductor-chip-mounting portion and a bonding pad portion on the surface and a ball pad portion on the reverse surface, and those portions were plated with nickel and gold, to obtain a printed circuit board.

A semiconductor chip having a 13×13 mm square size was bonded and fixed to the metal protrusion portion on the front surface with a silver paste, wire bonding was carried out, then, the semiconductor chip, the wire portion and the bonding pad portion were encapsulated with a silica-containing epoxy sealing compound by transfer molding, and solder balls were attached to the solder ball pad on the reverse surface, to obtain a semiconductor package (FIG. 10). The semiconductor package was connected to an epoxy resin motherboard printed circuit board by melting the solder balls. The semiconductor plastic package was evaluated, and Table 11 shows the results.

TABLE 11

|  |  | Example 23 |
|---|---|---|
| Heat resistance after moisture Absorption ① | Ordinary state | No failure |
|  | 24 hours | No failure |
|  | 48 hours | No failure |
|  | 72 hours | No failure |
|  | 96 hours | No failure |
|  | 120 hours | No failure |
|  | 144 hours | No failure |
|  | 168 hours | No failure |
| Heat resistance ② after moisture Absorption ① | Ordinary state | No failure |
|  | 24 hours | No failure |
|  | 48 hours | No failure |
|  | 72 hours | No failure |
|  | 96 hours | No failure |
|  | 120 hours | No failure |
|  | 144 hours | No failure |
|  | 168 hours | partly peeled |
| Tg | (° C.) | 234 |
| Heat diffusibilty | (° C.) | 32 |

Tg : Glass transition temperature

What is claimed is:

1. A semiconductor plastic package structured by fixing a semiconductor chip on one surface of a printed circuit board, connecting a semiconductor circuit conductor to a signal propagation circuit conductor formed on a printed circuit board surface in the vicinity thereof by wire bonding, at least connecting the signal propagation circuit conductor on the printed circuit board surface to another signal propagation circuit conductor formed on another surface of the printed circuit board or a connecting conductor pad of a solder ball with a through-hole conductor, and encapsulating the semiconductor chip with a resin, the printed circuit board having a metal sheet of nearly a same size as the printed circuit board and nearly in a center in a thickness direction of the printed circuit board, the metal sheet being insulated from front and reverse circuit conductors with a heat-resistant resin composition, the metal sheet being provided with at least one clearance hole having a diameter greater than a diameter of a through hole, the through hole being provided in the at least one clearance hole, and the through-hole being insulated from the metal sheet with a resin composition, at least one additional through-hole being connected to the metal sheet, one surface of the metal sheet being provided with at least one protrusion portion which is of a same size as the semiconductor chip and exposed on a surface, the semiconductor chip being fixed on the at least one protrusion portion, and another surface of the metal sheet being provided with a protrusion surface exposed for diffusing heat.

2. A semiconductor plastic package according to claim 1, wherein the at least one protrusion portion has a diameter or a side length that is 40 to 90% of a diameter or a side length of the semiconductor chip.

3. A semiconductor plastic package according to claim 2, wherein the signal propagation circuit conductors have at least three layers.

4. A semiconductor plastic package according to claim 1, wherein the metal sheet has portion which corresponds to a part or a whole of a marginal portion of the printed circuit board and is exposed on both the printed circuit board surface and the another surface thereof or on the another surface thereof.

5. A semiconductor plastic package according to claim 1, wherein the at least one clearance hole has the form of a slit having a width greater than a diameter of the through-hole.

\* \* \* \* \*